US012805124B2

(12) United States Patent
Shin et al.

(10) Patent No.: US 12,805,124 B2
(45) Date of Patent: Nov. 17, 2026

(54) DISPLAY DEVICE AND MANUFACTURING METHOD THEREOF

(71) Applicant: Samsung Display Co., Ltd., Yongin-si (KR)

(72) Inventors: Hyuneok Shin, Yongin-si (KR); Jonghee Park, Yongin-si (KR); Joonyong Park, Yongin-si (KR); Juhyun Lee, Yongin-si (KR); Yung Bin Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 282 days.

(21) Appl. No.: 18/519,132

(22) Filed: Nov. 27, 2023

(65) Prior Publication Data

US 2024/0268157 A1 Aug. 8, 2024

(30) Foreign Application Priority Data

Feb. 8, 2023 (KR) ........................ 10-2023-0016753

(51) Int. Cl.
*H10K 59/122* (2023.01)
*H10K 59/00* (2023.01)
(Continued)

(52) U.S. Cl.
CPC ........... *H10K 59/122* (2023.02); *H10K 59/12* (2023.02); *H10K 59/1201* (2023.02);
(Continued)

(58) Field of Classification Search
CPC ............. H10K 59/122; H10K 59/1201; H10K 59/771; H10K 59/88; H10K 59/353; H10K 59/12; H10K 50/13; H10K 50/19; H10K 59/32; H10K 59/8051; H10K 59/8052; H10K 59/873; H10K 71/231; H10K 71/60; H10K 2102/351; H10K 59/10–221;
(Continued)

(56) References Cited

U.S. PATENT DOCUMENTS

| | | | |
|---|---|---|---|
| 7,332,369 | B2 | 2/2008 | Veres et al. |
| 9,418,893 | B2 | 8/2016 | Park et al. |

(Continued)

FOREIGN PATENT DOCUMENTS

| | | | |
|---|---|---|---|
| JP | 2008-135325 | A | 6/2008 |
| KR | 10-2015-0026045 | A | 3/2015 |

*Primary Examiner* — Maliheh Malek
(74) *Attorney, Agent, or Firm* — Innovation Counsel LLP

(57) ABSTRACT

A display device including a base layer including a display area and a non-display area, the display area including a first emission area, a second emission area, a third emission area, and multiple non-emission areas. The display device also including, a pixel defining film exposing upper surfaces of each of the first to third lower electrodes, a conductive partition wall disposed on the pixel defining film and surrounding the third emission area in a plan view, a common emission pattern disposed on a first lower electrode and a second lower electrode and overlapping areas of the first emission area, the second emission area, and one of the non-emission areas disposed between the first emission area and the second emission area, and an auxiliary emission pattern disposed on the third lower electrode and overlapping the third emission area.

20 Claims, 32 Drawing Sheets

(51) Int. Cl.
*H10K 59/12* (2023.01)
*H10K 59/88* (2023.01)
*H10K 59/35* (2023.01)

(52) U.S. Cl.
CPC ........... *H10K 59/771* (2023.02); *H10K 59/88* (2023.02); *G09G 2300/0413* (2013.01); *G09G 2300/0439* (2013.01); *G09G 2300/0809* (2013.01); *H10K 59/353* (2023.02)

(58) Field of Classification Search
CPC .......... H10K 59/173; G09G 2300/0443–0447; G09G 2300/0809–0871; G09G 2300/0413
See application file for complete search history.

(56) References Cited

U.S. PATENT DOCUMENTS

| | | | | |
|---|---|---|---|---|
| 10,678,389 | B2 * | 6/2020 | Gunji | G06F 3/0443 |
| 10,957,756 | B2 * | 3/2021 | Lee | G09G 3/3225 |
| 11,158,693 | B2 * | 10/2021 | Chung | H10D 86/431 |
| 11,348,983 | B1 * | 5/2022 | Choung | H10K 59/173 |
| 11,527,732 | B1 * | 12/2022 | Chen | H10K 30/82 |
| 11,552,143 | B1 * | 1/2023 | Choung | H10K 59/122 |
| 11,610,954 | B1 * | 3/2023 | Lin | H10K 59/122 |
| 12,127,441 | B2 * | 10/2024 | Lin | H10K 59/122 |
| 12,133,442 | B2 * | 10/2024 | Na | G06F 3/0412 |
| 12,137,590 | B2 * | 11/2024 | Lee | H10K 59/122 |
| 12,284,901 | B2 * | 4/2025 | Seo | H10K 59/173 |
| 12,389,742 | B2 * | 8/2025 | Helander | H10H 20/84 |
| 12,453,252 | B1 * | 10/2025 | Lin | H10K 59/122 |
| 12,543,449 | B2 * | 2/2026 | Matsumoto | H10K 59/122 |
| 12,563,909 | B2 * | 2/2026 | Chen | H10K 59/122 |
| 12,568,735 | B2 * | 3/2026 | Shin | G09G 3/3233 |
| 12,641,980 | B2 * | 5/2026 | Yang | H10K 50/865 |
| 12,660,426 | B2 * | 6/2026 | Shin | H10K 59/122 |
| 2012/0228603 | A1 * | 9/2012 | Nakamura | H10K 59/122 257/40 |
| 2016/0079325 | A1 * | 3/2016 | Lee | H10K 59/1201 438/26 |
| 2016/0351846 | A1 * | 12/2016 | Kim | H10D 86/441 |
| 2019/0058156 | A1 * | 2/2019 | Sun | H10K 59/131 |
| 2020/0168670 | A1 * | 5/2020 | Kim | H10D 86/451 |
| 2021/0313498 | A1 * | 10/2021 | Kim | H10D 30/6723 |
| 2022/0077251 | A1 * | 3/2022 | Choung | H10K 59/173 |
| 2022/0077252 | A1 * | 3/2022 | Choung | H10K 59/173 |
| 2022/0077257 | A1 * | 3/2022 | Choung | H10K 59/173 |
| 2022/0102449 | A1 * | 3/2022 | Kim | G06F 3/0412 |
| 2022/0181410 | A1 * | 6/2022 | Kim | H10K 59/122 |
| 2022/0208867 | A1 * | 6/2022 | Heo | H10K 59/121 |
| 2022/0254864 | A1 * | 8/2022 | Lee | H10K 59/122 |
| 2022/0344417 | A1 * | 10/2022 | Choung | H10K 59/173 |
| 2023/0023079 | A1 * | 1/2023 | Lee | H10H 20/821 |
| 2023/0240098 | A1 * | 7/2023 | Lee | H10K 59/38 |
| 2023/0263012 | A1 * | 8/2023 | Chen | H10K 59/122 257/40 |
| 2024/0081101 | A1 * | 3/2024 | Shin | G09G 3/3233 |
| 2024/0121989 | A1 * | 4/2024 | Jung | H10K 59/38 |
| 2024/0122031 | A1 * | 4/2024 | Shin | H10K 50/17 |
| 2024/0130168 | A1 * | 4/2024 | Kang | H10K 59/00 |
| 2024/0172483 | A1 * | 5/2024 | Park | H10K 59/122 |
| 2024/0172540 | A1 * | 5/2024 | Bae | G02B 1/115 |
| 2024/0188336 | A1 * | 6/2024 | Choi | H10K 50/8445 |
| 2024/0196658 | A1 * | 6/2024 | Jo | H10K 59/122 |
| 2024/0196660 | A1 * | 6/2024 | Kim | H10K 59/1201 |
| 2024/0215323 | A1 * | 6/2024 | Shin | H10K 59/122 |
| 2024/0237424 | A1 * | 7/2024 | Jung | H10K 59/122 |
| 2024/0237493 | A1 * | 7/2024 | Chang | H10K 59/35 |
| 2024/0266471 | A1 * | 8/2024 | Lee | H10H 20/8312 |
| 2024/0276786 | A1 * | 8/2024 | Park | H10K 59/80517 |
| 2024/0349541 | A1 * | 10/2024 | Shin | H10K 59/122 |
| 2024/0381698 | A1 * | 11/2024 | Park | H10K 59/873 |
| 2025/0040404 | A1 * | 1/2025 | Lee | H10K 59/1201 |
| 2025/0048841 | A1 * | 2/2025 | Lee | H10K 59/122 |
| 2025/0056970 | A1 * | 2/2025 | Shin | H10K 59/122 |
| 2025/0063894 | A1 * | 2/2025 | Choi | H10K 59/1201 |
| 2025/0089481 | A1 * | 3/2025 | Hwang | H10K 50/115 |
| 2025/0133929 | A1 * | 4/2025 | Joo | H10H 20/01 |
| 2025/0143107 | A1 * | 5/2025 | Park | H10K 59/1213 |
| 2025/0169286 | A1 * | 5/2025 | Lee | H10K 59/1201 |
| 2025/0176402 | A1 * | 5/2025 | Shin | H10K 59/80521 |
| 2025/0194349 | A1 * | 6/2025 | Shin | H10K 59/8792 |
| 2025/0255104 | A1 * | 8/2025 | Shin | H10K 59/873 |
| 2025/0311555 | A1 * | 10/2025 | Shin | H10K 59/122 |
| 2025/0311557 | A1 * | 10/2025 | Shin | H10K 59/122 |
| 2025/0318398 | A1 * | 10/2025 | Kim | H10K 59/38 |
| 2025/0324853 | A1 * | 10/2025 | Lee | H10K 59/122 |
| 2025/0374766 | A1 * | 12/2025 | Oh | H10K 59/122 |
| 2026/0007002 | A1 * | 1/2026 | Kim | H10K 59/122 |
| 2026/0033144 | A1 * | 1/2026 | Shin | H10K 59/122 |
| 2026/0143918 | A1 * | 5/2026 | Kim | H10K 59/1201 |
| 2026/0157064 | A1 * | 6/2026 | Lee | H10K 59/131 |

* cited by examiner

DISPLAY DEVICE AND MANUFACTURING METHOD THEREOF

CROSS-REFERENCE TO RELATED APPLICATIONS

This application claims priority under 35 U.S.C. § 119 from Korean Patent Application No. 10-2023-0016753 filed on Feb. 8, 2023 in the Korean Intellectual Property Office, the entire contents of which are incorporated herein by reference.

BACKGROUND

1. Technical Field

The disclosure herein relates to a display device including a conductive bank and a common emission pattern and a method of manufacturing thereof.

2. Description of the Related Art

Multimedia electronic devices such as televisions, mobile phones, tablets, computers, navigation devices, game machines, and the like have display panels for displaying images. The display panel includes a light emitting element and a pixel circuit for driving the light emitting element. Light emitting elements included in the display panel emit light according to the voltage applied from the pixel circuit and create an image. In order to improve the reliability of display panels, research on patterning of light emitting elements is being conducted, and recently, research on a method of patterning a commonly provided light emitting material in pixel portions using an open mask is being conducted.

SUMMARY

The disclosure provides a display device capable of realizing high resolution. The disclosure also provides a manufacturing method of a display device capable of realizing high resolution.

An embodiment of this disclosure may provide a display device including a base layer including a display area including a first emission area, a second emission area, a third emission area, and a non-emission area and multiple non-display areas, a first lower electrode disposed on the base layer and overlapping the first emission area, a second lower electrode disposed on the base layer and overlapping the second emission area, a third lower electrode disposed on the base layer and overlapping the third emission area, a pixel defining film exposing upper surfaces of each of the first to third lower electrodes, a conductive bank disposed on the pixel defining film and surrounding the third emission area in a plan view, a common emission pattern disposed on the first lower electrode and the second lower electrode, and overlapping the first emission area, the second emission area, and one of the non-emission areas disposed between the first emission area and the second emission area, and an auxiliary emission pattern disposed on the third lower electrode and overlapping the third emission area.

In an embodiment, the display device may further include a first upper electrode disposed on the common emission pattern and electrically connected to a side surface of the conductive bank, and a second upper electrode disposed on the auxiliary emission pattern and electrically connected to another side surface of the conductive bank.

In an embodiment, the display device may further include a first encapsulation inorganic pattern covering the first upper electrode and overlapping the first emission area and the second emission area, and a second encapsulation inorganic pattern covering the second upper electrode and overlapping the third emission area.

In an embodiment, the conductive bank may include a first conductive layer having a first conductivity, and a second conductive layer disposed on the first conductive layer and having a second conductivity lower than the first conductivity, wherein a thickness of the first conductive layer may be greater than a thickness of the second conductive layer.

In an embodiment, the display device may further include a first dummy pattern disposed on a side of an upper surface of the second conductive layer, wherein the first dummy pattern may include a dummy common emission pattern disposed on the upper surface of the second conductive layer and including a same material as the common emission pattern, and a dummy first upper electrode disposed on the dummy common emission pattern and including a same material as the first upper electrode.

In an embodiment, the display device may further include a second dummy pattern disposed on a side of an upper surface of the second conductive layer, wherein the second dummy pattern may include a dummy auxiliary emission pattern disposed on the upper surface of the second conductive layer and including a same material as the auxiliary emission pattern, and a dummy second upper electrode disposed on the dummy auxiliary emission pattern and including a same material as the second upper electrode.

In an embodiment, a first opening corresponding to the third emission area may be defined in the conductive bank, wherein the auxiliary emission pattern may be disposed within the first opening.

In an embodiment, the common emission pattern may include a first color light emitting layer and a second color light emitting layer disposed on the first color light emitting layer and including a material different from a material of the first color light emitting layer.

In an embodiment, the first lower electrode may include a first reflective electrode and a first transparent oxide electrode disposed on the first reflective electrode, wherein the second lower electrode may include a second reflective electrode and a second transparent oxide electrode disposed on the second reflective electrode, wherein a thickness of the second transparent oxide electrode may be greater than a thickness of the first transparent oxide electrode.

In an embodiment, the first transparent oxide electrode may include a first crystallized region, wherein the second transparent oxide electrode may include a second crystallized region and an amorphous region disposed on the second crystallized region.

In an embodiment, an etch rate of the amorphous region in an etching solution is greater than an etch rate of each of the second crystallized region and an etch rate of the first crystallized region.

In an embodiment, a minimum separation distance between the first lower electrode and the second lower electrode in a plan view may be smaller than a minimum separation distance between the second lower electrode and the third lower electrode in a plan view.

In an embodiment, the conductive bank may not overlap an area between the first lower electrode and the second lower electrode in the one of the non-emission areas.

In an embodiment, the display device may further include a sacrificial pattern disposed on an outer region of the third lower electrode and disposed between the third lower electrode and the pixel defining film.

In an embodiment of this disclosure, a method of manufacturing a display device may include providing a base layer including a display area and a non-display area, the display area including a first emission area, a second emission area, a third emission area, and a plurality of non-emission areas, forming a first lower electrode on the base layer, the first lower electrode overlapping a first emission area; forming a second lower electrode on the base layer, the second lower electrode overlapping a second emission area, forming a third lower electrode on the base layer, the third lower electrode overlapping a third emission area, forming a pixel defining film on the base layer and exposing an upper surface of each of the first to third lower electrodes, forming a conductive bank on the pixel defining film and surrounding the third emission area in a plan view, forming an auxiliary emission pattern disposed on the third lower electrode and overlapping the third emission area, and forming a common emission pattern on the first lower electrode and the second lower electrode and overlapping the first emission area, the second emission area, and one of the non-emission areas being disposed between the first emission area and the second emission area.

In an embodiment, the forming of the first lower electrode may include forming a preliminary first lower electrode overlapping the first emission area on the base layer, and forming the first lower electrode by etching a portion of an upper side of the preliminary first lower electrode.

In an embodiment, the method may further include, after the forming of the auxiliary emission pattern, forming a first upper electrode on the auxiliary emission pattern, the first upper electrode pattern being electrically connected to a side surface of the conductive bank.

In an embodiment, the method may further include, after the forming of the common emission pattern, forming a second upper electrode on the common emission pattern, the second upper electrode being electrically connected to a side surface of the conductive bank.

In an embodiment, the forming of the conductive bank may include forming a preliminary conductive bank layer on the pixel defining film, forming a preliminary first opening corresponding to the third emission area in the preliminary conductive bank layer, and forming the first opening from the preliminary first opening of the preliminary conductive bank layer.

In an embodiment, the preliminary conductive bank layer may include a first conductive layer having a first conductivity, and a second conductive layer disposed on the first conductive layer and having a second conductivity lower than the first conductivity, wherein in the forming of the preliminary first opening, the first conductive layer and the second conductive layer may be dry etched, wherein in the forming of the first opening, the first conductive layer and the second conductive layer may be wet etched.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
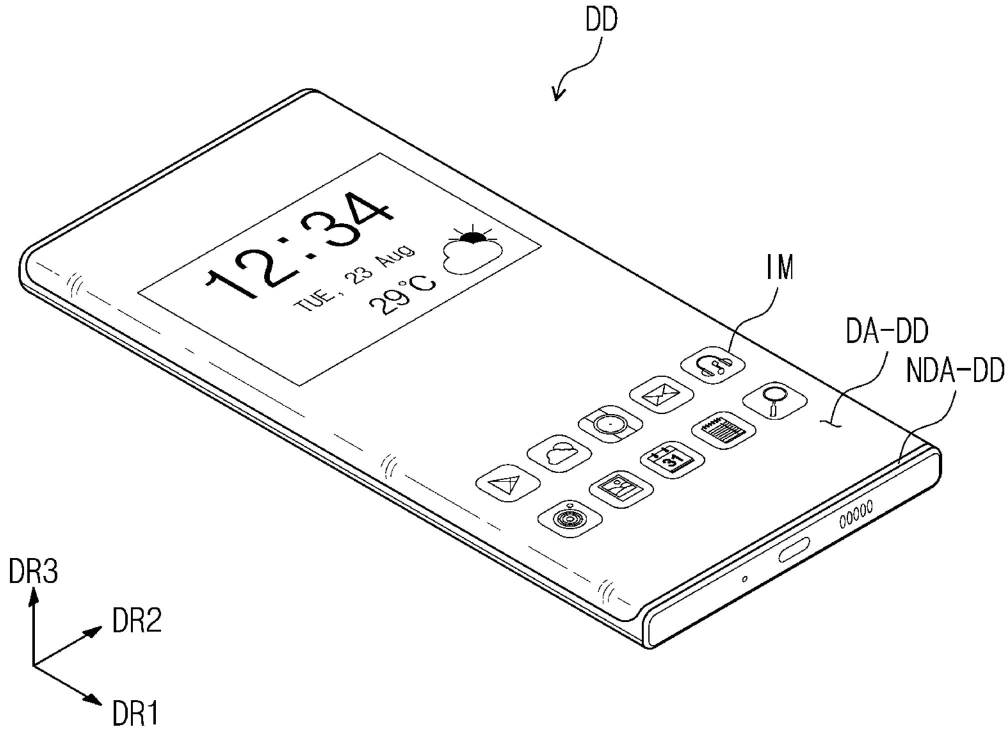
FIG. 1 is a perspective view of a display device according to an embodiment of this disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be predisposed differently from the described order. For example, two consecutively described processes may be predisposed substantially at a same time or predisposed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," "directly disposed," or "directly coupled to" another element or layer, there are no intervening elements or layers present. In case that an element is "directly placed" on another element, it means that an element is in "contact" with the other element. In the specification, "component A is directly disposed on component B" means that an adhesive layer may not be disposed between component A and component B. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis may not be limited to three axes of a rectangular coordinate system, such as the x, y, and z axes, and may be interpreted in a broader sense. For example, the X-axis, the Y-axis, and the Z-axis may be perpendicular to one another, or may be different directions that may not be perpendicular to one another.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items. A description that a component is "configured to" perform a specified operation may be defined as a case where the component is constructed and arranged with structural features that can cause the component to perform the specified operation.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, may not be necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be disposed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, portion, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein. Hereinafter, embodiments of this disclosure will be described with reference to the drawings.

FIG. 1 is a perspective view of a display device DD according to an embodiment of this disclosure. Referring to FIG. 1, a mobile phone is illustrated as an example of a display device DD. However, the display device DD of this disclosure may not be limited thereto, and may be various display devices such as a television, a tablet, a navigation device, and a game machine. The display device DD may display the image IM through the active area DA-DD. The active area DA-DD may include a plane defined by the first direction DR1 and the second direction DR2. The active area DA-DD may include a curved surface bent from at least a side of a plane defined by the first and second directions DR1 and DR2. However, this is an example, and the shape of the active area DA-DD may not be limited thereto. For example, the active area DA-DD may include only the plane, and the active area DA-DD may further include four curved surfaces each bent from at least two or more, for example, four side surfaces of the plane.

The peripheral area NDA-DD may be adjacent to the active area DA-DD. The peripheral area NDA-DD may surround the active area DA-DD. Accordingly, the shape of the active area DA-DD may be substantially defined by the peripheral area NDA-DD. However, this is shown as an example, and the peripheral area NDA-DD may be disposed adjacent to only a side of the active area DA-DD or may be omitted. The active area DA-DD may be provided in various shapes and may not be limited to any an embodiment.

Figure 2:
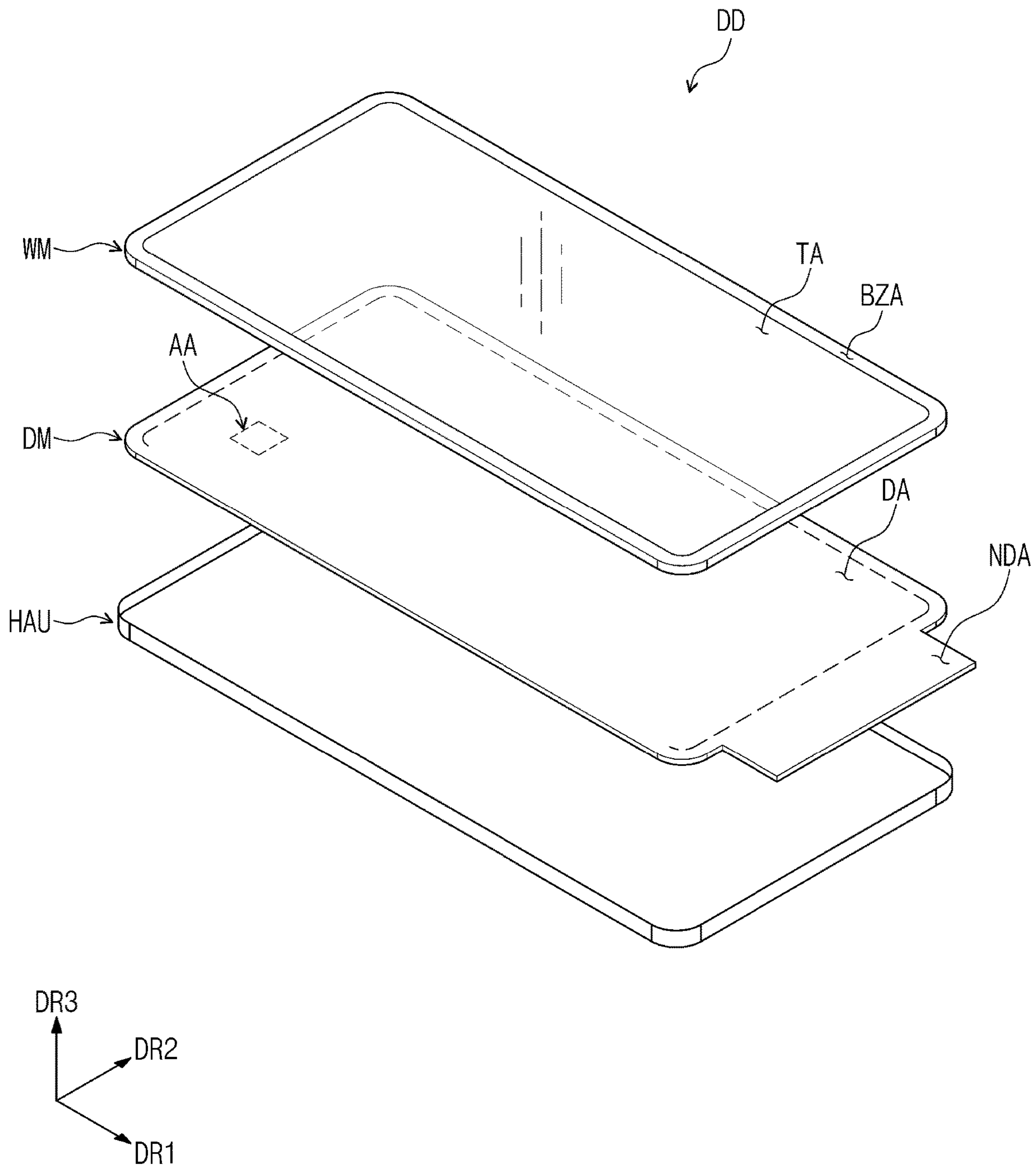
FIG. 2 is an exploded perspective view of a display device according to an embodiment of this disclosure.

FIG. 2 is an exploded perspective view of a display device DD according to an embodiment of this disclosure. Referring to FIG. 2, the display device DD may include a housing HAU, a display module DM, and a window member WM.

The display module DM may be disposed below the window member WM. The display module DM may be a component that substantially generates an image IM (see FIG. 1). The image IM (see FIG. 1) generated by the display module DM is displayed on the display surface of the display module DM, and may be visually recognized by the user from the outside through the transmission area TA.

The display module DM includes a display area DA and a non-display area NDA. The display area DA may be an area activated according to an electrical signal. The non-display area NDA is adjacent to the display area DA. The non-display area NDA may surround the display area DA. The non-display area NDA is an area covered by the bezel area BZA and may not be visible from the outside.

The window member WM may cover the entire outer side of the display module DM. The window member WM may include a transmission area TA and a bezel area BZA. The front surface of the window member WM including the transmission area TA and the bezel area BZA may correspond to the front surface of the display device DD. The transmission area TA corresponds to the active area DA-DD of the display device DD shown in FIG. 1, and the bezel area BZA corresponds to the peripheral area NDA-DD of the display device DD shown in FIG. 1.

The transmission area TA may be an optically transparent area. The bezel area BZA may be an area having relatively low light transmittance compared to the transmission area TA. The bezel area BZA may have a color. The bezel area BZA is adjacent to the transmission area TA and may surround the transmission area TA. The bezel area BZA may define the shape of the transmission area TA. However, the embodiment may not be limited to the illustrated one, and the bezel area BZA may be disposed adjacent to only one side of the transmission area TA, or a portion may be omitted.

Although not shown, an input detection portion may be provided on the display module DM. The input detection portion may detect an external input applied from the outside. The external input may be a user's input. The user's input may include various types of external inputs such as a part of the user's body, light, heat, pen, or pressure. More specifically, an input detection portion (not shown) may be disposed on an encapsulation layer TFE (see FIG. 5) of a display module DM, which will be described later. The input detection portion (not shown) may be disposed on (e.g., directly disposed on) the encapsulation layer TFE (see FIG. 5) or disposed on (e.g., directly disposed on) an adhesive member (not shown) disposed on the encapsulation layer TFE (see FIG. 5). The adhesive member may include a conventional adhesive or pressure-sensitive adhesive.

The housing HAU may accommodate the display module DM and the like. The housing HAU may be coupled to the window member WM. The housing HAU may be coupled to the window member WM to provide an internal space. The display module DM may be accommodated in the inner space.

The housing HAU may include a material with relatively high rigidity. For example, the housing HAU may include multiple frames and/or plates made of glass, plastic, or metal, or a combination thereof. The housing HAU may stably protect components of the display device DD (see FIG. 1) accommodated in the internal space from external impact.

Figure 3:
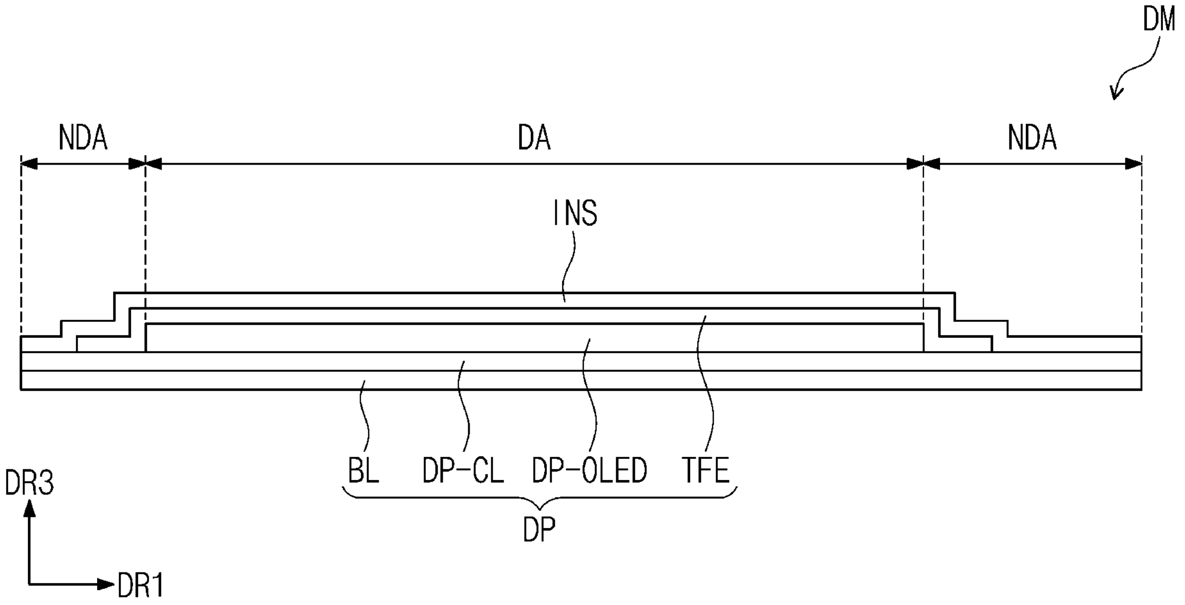
FIG. 3 is a schematic cross-sectional view of a display module according to an embodiment of this disclosure.

FIG. 3 is a schematic cross-sectional view of a display module DM according to an embodiment of this disclosure. Referring to FIG. 3, the display module DM according to the embodiment may include a display panel DP and an input sensor INS. Although not separately shown, the display device DD according to an embodiment of this disclosure may further include a protection member disposed on a lower surface of the display panel DP or an anti-reflection member and/or a window member disposed on an upper surface of the input sensor INS.

The display panel DP may be a light emitting display panel, and may not be particularly limited. For example, the display panel DP may be an organic light emitting display panel or an inorganic light emitting display panel. The light emitting layer in the organic light emitting display panel may include an organic light emitting material. The light emitting layer in the inorganic light emitting display panel may include quantum dots, quantum rods, or micro LEDs. Hereinafter, the display panel DP is described as the organic light emitting display panel.

The display panel DP may include a base layer BL, a circuit element layer DP-CL disposed on the base layer BL, a display element layer DP-OLED, and a thin film encapsulation layer TFE. The input sensor INS may be disposed on (e.g., directly disposed on) the thin film encapsulation layer TFE. The base layer BL may include at least one plastic film. The base layer BL is a flexible substrate and may include a plastic substrate, a glass substrate, a metal substrate, or an organic/inorganic composite material substrate. The display area DA and the non-display area NDA described with reference to FIG. 2 may be equally defined in the base layer BL.

The circuit element layer DP-CL may include at least one insulating layer and a circuit element. The insulating layer may include at least one inorganic layer and at least one organic layer. The circuit element may include signal lines, a driving circuit of a pixel, and the like.

The display element layer DP-OLED may include a conductive bank (or conductive partition wall) and a light emitting element. The light emitting element may include a lower electrode, an auxiliary emission pattern, and an upper electrode.

The thin film encapsulation layer TFE may include multiple thin films. Some thin films are disposed to improve optical efficiency, and some thin films are disposed to protect organic light emitting diodes.

The input sensor INS may acquire coordinate information of an external input. The input sensor INS may have a multilayer structure. The input sensor INS may include a single layer or multiple conductive layers. The input sensor INS may include a single or multilayer insulating layer. The input sensor INS may sense an external input in a capacitive manner, for example. In this disclosure, the operation method of the input sensor INS may not be particularly limited, and in an embodiment of this disclosure, the input sensor INS may sense an external input using an electromagnetic induction method or a pressure sensing method. In an embodiment of this disclosure, the input sensor INS may be omitted.

Figure 4:
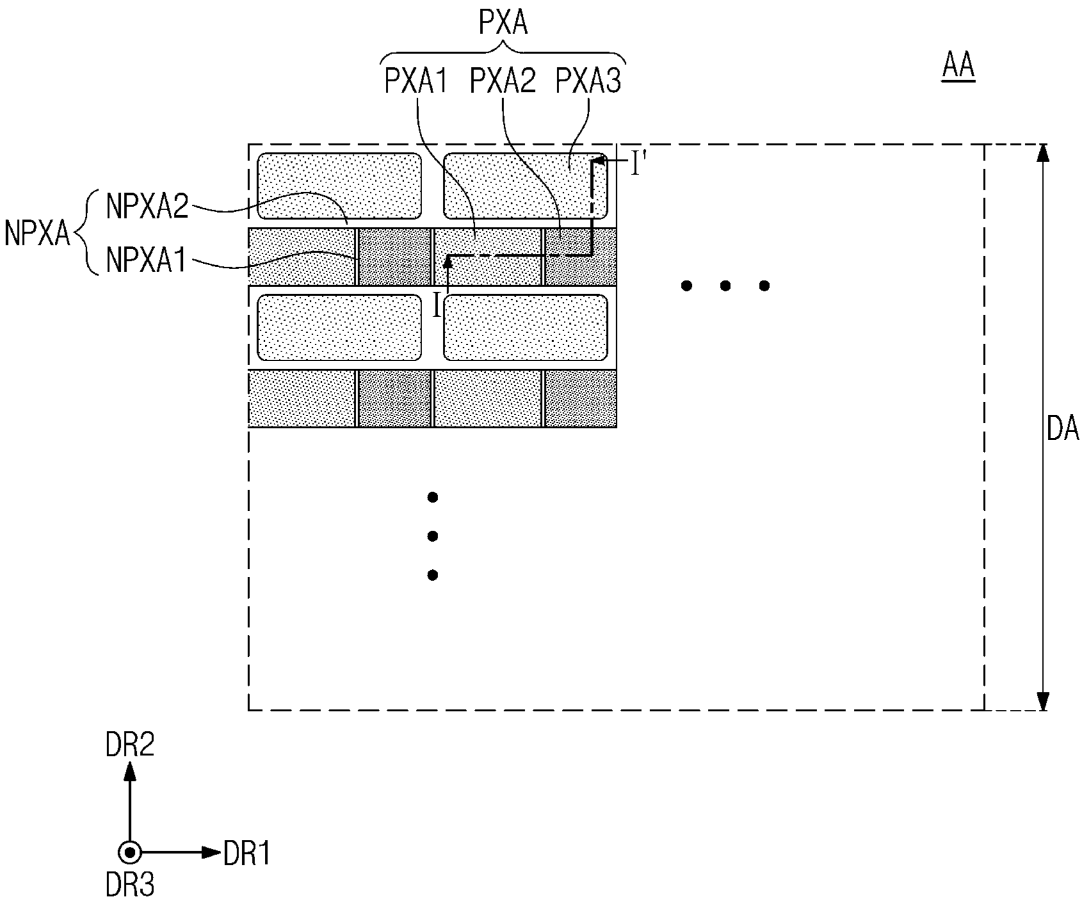
FIG. 4 is an enlarged plan view of an area AA of FIG. 2 according to an embodiment of this disclosure.

FIG. 4 is an enlarged plan view of an area AA of FIG. 2 according to an embodiment of this disclosure. Referring to FIG. 4, the display area DA may include an emission area PXA and non-emission areas NPXA surrounding the emission area PXA. The emission area PXA may include a first emission area PXA1, a second emission area PXA2, and a third emission area PXA3. The first to third emission areas PXA1, PXA2, and PXA3 may respectively correspond to areas in which light provided from the first to third light emitting elements ED1, ED2, and ED3 (see FIG. 5).

In FIG. 4, for convenience of description, among the components of the first to third light emitting elements ED1, ED2, and ED3 (see FIG. 5), only the first to third lower electrodes LE1, LE2, and LE3 (see FIG. 5) are illustrated as examples. The first to third emission areas PXA1, PXA2, and PXA3 may be classified according to the color of light emitted toward the outside of the display module DM (see FIG. 2). Here, the first to third emission areas PXA1, PXA2, and PXA3 and the non-emission areas NPXA may be equally defined in the base layer BL (see FIG. 3).

The first to third emission areas PXA1, PXA2, and PXA3 may provide first to third color lights having different colors, respectively. For example, the first color light may be red light, the second color light may be green light, and the third color light may be blue light. However, examples of the first to third color lights are not necessarily limited to the above example.

Figure 5:
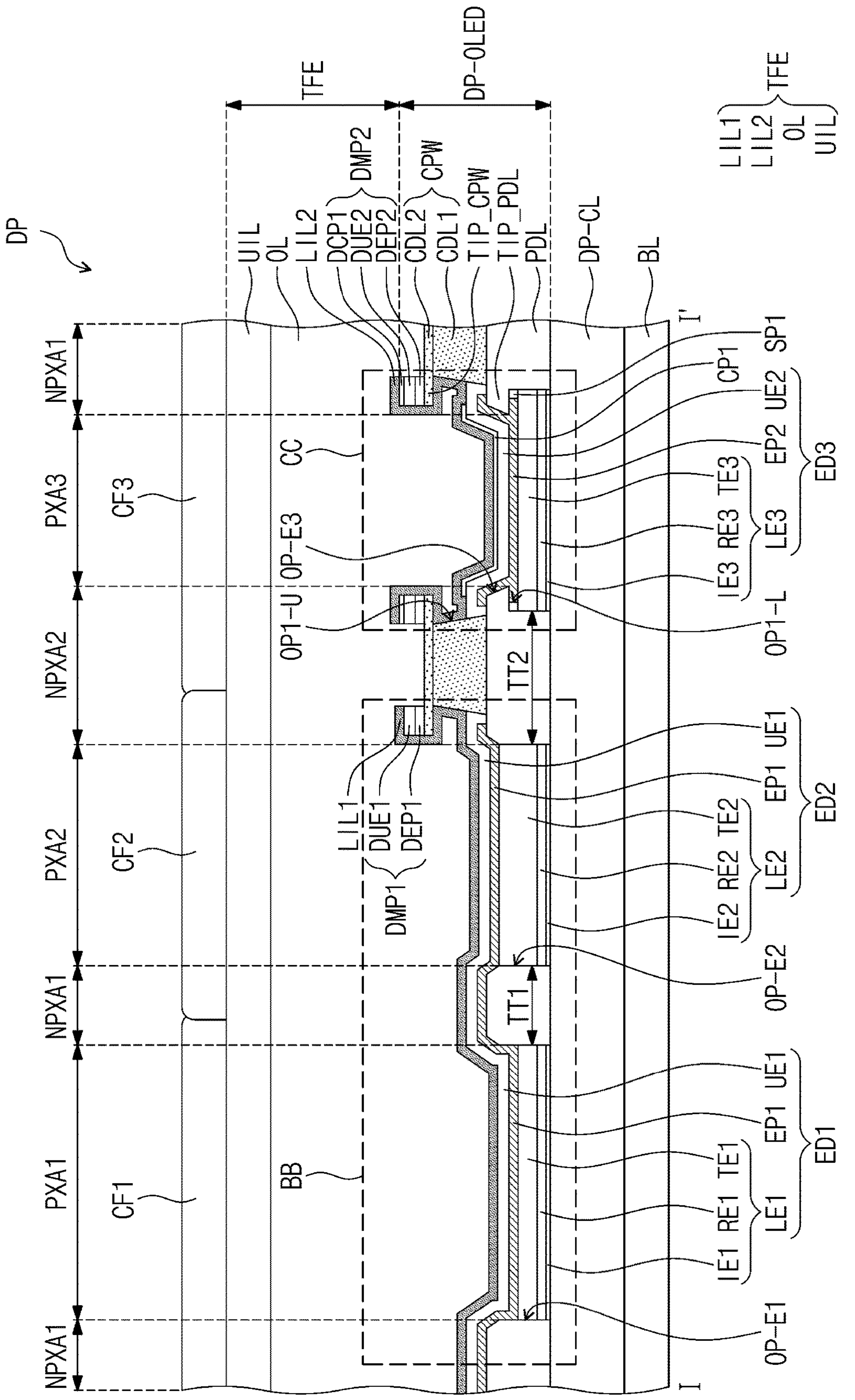
FIG. 5 is a schematic cross-sectional view taken along line I-I' of FIG. 4 according to an embodiment of this disclosure.

Each of the first to third emission areas PXA1, PXA2, and PXA3 may be defined as an area where upper surfaces of each of the corresponding first to third lower electrodes LE1, LE2, and LE3 (see FIG. 5) are exposed by openings formed in the pixel defining layer PDL (see FIG. 5).

An area occupied by the third emission area PXA3 in a plan view may be larger than an area occupied by the first emission area PXA1 in a plan view. An area occupied by the third emission area PXA3 in a plan view may be larger than an area occupied by the second emission area PXA2 in a plan view. An area occupied by the second emission area PXA2 in a plan view may be larger than an area occupied by the first emission area PXA1 in a plan view.

The first emission area PXA1 may be defined as an area exposed by the first emission opening OP-E1 on the upper surface of the first lower electrode LE1, the second emission area PXA2 may be defined as an area exposed by the second emission opening OP-E2 on the upper surface of the second lower electrode LE2, and the third emission area PXA3 may be defined as an area exposed by the third emission opening OP-E3 on the upper surface of the third lower electrode LE3.

The non-emission areas NPXA may set boundaries of the first to third emission areas PXA1, PXA2, and PXA3, and prevent color mixing between the first to third emission areas PXA1, PXA2, and PXA3. The non-emission areas NPXA may include a first non-emission area NPXA1 and a second non-emission area NPXA2. The first emission area NPXA1 may be disposed between the first emission area PXA1 and the second emission area PXA2. The second emission area NPXA2 may surround the third emission area PXA3 in a plan view. The second non-emission area NPXA2 may be an area corresponding to a conductive bank CPW (see FIG. 5) described later. The conductive bank CPW (see FIG. 5) may surround the third emission area PXA3 in a plan view. However, the meaning of enclosing here does not mean that all corners of the third emission area PXA3 are tightly surrounded in a plan view. For example, the second emission area NPXA2 or the conductive bank CPW (see FIG. 5) may surround two or more corners of the corners of the third emission area PXA3.

A planar thickness of the second emission area NPXA2 may be greater than a planar thickness of the first emission area NPXA1. A first area occupied by the second emission area NPXA2 in a plan view may be larger than a second area occupied by the first emission area NPXA1 in a plan view. This is because the emission patterns corresponding to the first emission area PXA1 and the second emission area PXA2 are deposited in a common emission pattern EP1 (see FIG. 5), such that a separate space may not be required between the first emission area PXA1 and the second emission area PXA2. Since a space in which a conductive bank CPW is to be formed is required around the third emission area PXA3, an area occupied in a plan view by the second emission area NPXA2 corresponding to the conductive bank CPW may be large.

Each of the first to third emission areas PXA1, PXA2, and PXA3 may be provided in plural and may be repeatedly arranged in an arrangement form within the display area DA. For example, each of the first and second emission areas PXA1 and PXA2 may be alternately arranged along the first direction DR1 to constitute a 'first group'. The third emission areas PXA3 may be arranged along the first direction DR1 to constitute a 'second group'. Each of the 'first group' and the 'second group' may be provided in plural numbers, and the 'first groups' and 'second groups' may be alternately arranged along the second direction DR2.

FIG. 4 exemplarily illustrates an arrangement form of the first to third emission areas PXA1, PXA2, and PXA3, but may not be limited thereto and the first to third emission areas PXA1, PXA2, and PXA3 may be arranged in various forms. In an embodiment, the first to third emission areas PXA1, PXA2, and PXA3 may have a PenTile™ arrangement. The first to third emission areas PXA1, PXA2, and PXA3 may have a stripe arrangement or a diamond PenTile™ arrangement.

Each of the first to third emission areas PXA1, PXA2, and PXA3 may have various shapes in a plan view. For example, each of the first to third emission areas PXA1, PXA2, and PXA3 may have a polygonal shape, a circular shape, or an elliptical shape. FIG. 4 exemplarily illustrates each of the first and third emission areas PXA1 and PXA3 having a quadrangular shape in a plan view.

The first to third emission areas PXA1, PXA2, and PXA3 may have a same shape in a plan view, or at least some of them may have different shapes. FIG. 4 exemplarily illustrates first to third emission areas PXA1, PXA2, and PXA3 having different shapes in a plan view.

At least some of the first to third emission areas PXA1, PXA2, and PXA3 may have different areas in a plan view. In an embodiment, the area of the first emission area PXA1 emitting red light may be larger than the area of the second emission area PXA2 emitting green light, and may be smaller than the area of the third emission area PXA3 emitting blue light. However, the size relationship of each area of the first to third emission areas PXA1, PXA2, and PXA3 according to the emission color may not be limited thereto and may vary according to the design of the display module DM (see FIG. 2). This disclosure may not be limited thereto, and each of the first to third emission areas PXA1, PXA2, and PXA3 may have a same area in a plan view.

The shape, area, and arrangement of the first to third emission areas PXA1, PXA2, and PXA3 of the display module DM (see FIG. 2) of this disclosure may be designed in various ways depending on the color of the emitted light or the size and configuration of the display module DM (see FIG. 2), and are not limited to the embodiment shown in FIG. 4.

FIG. 5 is a schematic cross-sectional view taken along line I-I' of FIG. 4 according to an embodiment of this disclosure. Referring to FIG. 5, the display panel DP may include a base layer BL, a circuit element layer DP-CL, a display element layer DP-OLED, a thin film encapsulation layer TFE, and color filters CF1, CF2, and CF3.

The base layer BL may include a synthetic resin film. The base layer BL may include a glass substrate, a metal substrate, an organic/inorganic composite material substrate, or a combination thereof.

At least one inorganic layer may be disposed on the upper surface of the base layer BL. Although not shown, the buffer layer (not shown) may improve bonding strength between the base layer BL and the semiconductor pattern. The buffer layer (not shown) may include a silicon oxide layer and a silicon nitride layer. The silicon oxide layer and the silicon nitride layer may be alternately stacked on each other.

The display panel DP may include multiple insulating layers, a semiconductor pattern, a conductive pattern, a signal line, and the like. An insulating layer, a semiconductor layer, and a conductive layer are formed by a method such as coating or vapor deposition. Thereafter, the insulating layer, the semiconductor layer, and the conductive layer may be selectively patterned by photolithography and etching. In this way, semiconductor patterns, conductive patterns, signal lines, and the like included in the circuit element layer DP-CL and the display element layer DP-OLED may be formed.

A circuit element layer DP-CL may be disposed on the base layer BL. Multiple insulating layers, transistors, connection electrodes, and the like may be disposed on the circuit element layer DP-CL. Each transistor may include a gate and a semiconductor pattern including a source region, a drain region, and a channel portion. Each transistor and each of the first to third lower electrodes LE1, LE2, and LE3 may be electrically connected by the connection electrode. Here, a specific schematic cross-sectional structure of the circuit element layer DP-CL may not be shown.

A display element layer DP-OLED may be disposed on the circuit element layer DP-CL. According to this embodiment, the display element layer DP-OLED may include a pixel defining layer PDL, first to third light emitting elements ED1, ED2, and ED3, a first sacrificial pattern SP1, a conductive bank CPW, and first and second dummy patterns DMP1 and DMP2.

The pixel defining film PDL is disposed on the base layer BL and first to third emission openings OP-E1, OP-E2, and OP-E3 corresponding to the first to third emission areas PXA1, PXA2, and PXA3, respectively, may be defined. The pixel defining film PDL may expose at least a portion of the upper surface of each of the first to third lower electrodes LE1, LE2, and LE3.

The pixel defining film PDL may include an inorganic insulating material, for example, silicon nitride SiNx. The pixel defining film PDL may be disposed between the second lower electrode LE2, the third lower electrode LE3 and the conductive bank CPW, and block electrical connection between each of the second and third lower electrodes LE2 and LE3 and the conductive bank CPW.

The first light emitting element ED1 may include a first lower electrode LE1, a common emission pattern EP1, and a first upper electrode UE1. The first lower electrode LE1 may be disposed on the base layer BL and may overlap the first emission area PXA1. The first lower electrode LE1 may be disposed on the circuit element layer DP-CL. The first lower electrode LE1 may be an anode or cathode electrode.

The first lower electrode LE1 may include a first oxidation electrode IE1, a first reflective electrode RE1, and a first transparent oxide electrode TE1. The first lower electrode LE1 may have a stacked structure in which a first oxidation electrode IE1, a first reflective electrode RE1, and a first transparent oxide electrode TE1 are sequentially stacked on each other. The first lower electrode LE1 may be a resonance electrode. The first lower electrode LE1 shown in FIG. 5 shows the structure of a resonance electrode as an example, and the structure of the first lower electrode LE1 may not be limited thereto. The first lower electrode LE1 may have various structures according to needs, such as a design according to resonance.

The first oxidation electrode IE1 may include a transparent conductive oxide. The first oxidation electrode IE1 may include a same material as the first transparent oxide electrode TE1 or may include a different material. The first oxidation electrode IE1 may be omitted if necessary.

The first reflective electrode RE1 may be disposed on the first oxidation electrode IE1. The first reflective electrode RE1 may include a metal material. For example, the first reflective electrode RE1 may be a reflective layer composed of highly reflective silver (Ag), magnesium (Mg), aluminum (Al), platinum (Pt), palladium (Pd), gold (Au), nickel (Ni), neodymium (Nd), iridium (Ir), Chromium (Cr), a compound thereof, or a combination thereof. For example, the first reflective electrode RE1 may include silver (Ag).

The first transparent oxide electrode TE1 may be disposed on the first reflective electrode RE1. The first transparent oxide electrode TE1 may include a transparent conductive oxide. For example, the first transparent oxide electrode TE1 may be a transparent or translucent electrode layer including at least one selected from the group consisting of indium tin oxide (ITO), indium zinc oxide (IZO), indium gallium zinc oxide (IGZO), zinc oxide (ZnO), indium oxide ($In_2O_3$), and aluminum doped zinc oxide (AZO). For example, the first transparent oxide electrode TE1 may be indium gallium zinc oxide (IGZO).

The minimum separation distance TT1 between the first lower electrode LE1 and the second lower electrode LE2 in a plan view may be smaller than the minimum separation distance TT2 between the second lower electrode LE2 and the third lower electrode LE3 in a plan view. This is because a space for the conductive bank CPW is required between the second lower electrode LE2 and the third lower electrode LE3.

In the display panel DP of FIG. 5, in case that the first light emitting element ED1 and the second light emitting element ED2 are formed, the common light emitting layer EP1, which is a light emitting structure, may be simultaneously stacked. Accordingly, compared to the case of forming the light emitting layer on each of the first light emitting element ED1 and the second light emitting element ED2, a distance between the first light emitting element ED1 and the second light emitting element ED2 may be reduced. As such, since the distance between the first lower electrode LE1 and the second lower electrode LE2 may be reduced, a high-resolution display device DD (see FIG. 1) may be implemented by reducing the distance between the emission areas PXA1, PXA2, and PXA3.

In the display panel DP of this disclosure, in case of forming the first light emitting element ED1 and the second light emitting element ED2, a common layer may be deposited simultaneously. In case of forming the third light emitting element ED3, deposition may be performed using the conductive bank CPW as a mask. Accordingly, a fine metal mask (FMM) may be unnecessary to form the first to third light emitting elements ED1, ED2, and ED3. Accordingly, since a spacer or the like for the FMM process is unnecessary, a distance between each of the light emitting elements ED1, ED2, and ED3 may be reduced. The resolution of the display panel DP may therefore be increased.

The common emission pattern EP1 may be provided as a common layer in the first light emitting element ED1 and the second light emitting element ED2. The common emission pattern EP1 may be a light emitting element having a tandem structure. The common emission pattern EP1 may be disposed on the first lower electrode LE1 and the second lower electrode LE2. The common emission pattern EP1 may overlap the first emission area PXA1 and the second emission area PXA2. The common emission pattern EP1 may overlap the first non-emission area NPXA1, which is an area disposed between the first emission area PXA1 and the second emission area PXA2 of the non-emission areas NPXA. In this disclosure, the overlapping of a certain element with an element may not be limited to the same area and the same shape in a plan view, and includes cases having different areas and/or different shapes. A detailed structure of the common emission pattern EP1 will be described in more detail later.

Figure 8:
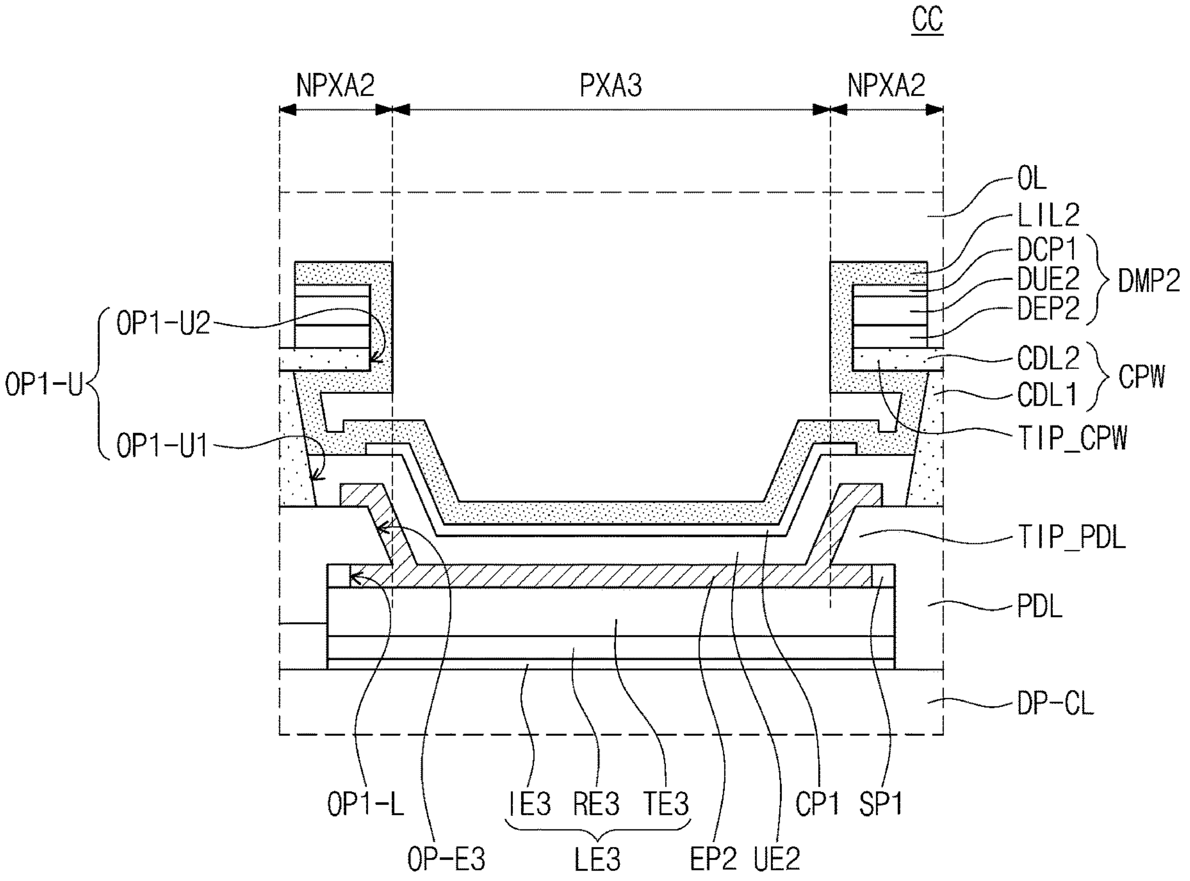
FIG. 8 is an enlarged schematic cross-sectional view of a region CC of FIG. 5 according to an embodiment of this disclosure.

The first upper electrode UE1 may be disposed on the common emission pattern EP1 and may contact a side surface of the conductive bank CPW. The first upper electrode UE1 may be provided as a common layer in the first light emitting element ED1 and the second light emitting element ED2. The first upper electrode UE1 may be electrically connected to the conductive bank CPW and receive a bias voltage through the conductive bank CPW. The first upper electrode UE1 may be patterned by a tip-portion defined in the conductive bank CPW. Referring to FIG. 8, the tip-part TIP_CPW of the conductive bank CPW may be a portion of the second conductive layer CDL2 closer to the center of the first lower opening OP1-L than the inner surface of the first conductive layer CDL1 defining the first areas OP1-U1.

The first upper electrode UE1 may cover the common emission pattern EP1. The first upper electrode UE1 may overlap the first emission area PXA1, the second emission area PXA2, and the first non-emission area NPXA1. As the first upper electrode UE1 may be electrically connected to the conductive bank CPW having a relatively large thickness, it may be possible to provide the first and second light emitting elements ED1 and ED2 having reduced driving resistance, while increasing luminous efficiency and increasing lifespan.

The second light emitting element ED2 may include a second lower electrode LE2, a common emission pattern EP1, and a first upper electrode UE1. Here, since the common emission pattern EP1 and the first upper electrode UE1 have been described in terms of the first light emitting element ED1, a description thereof will be omitted.

The second lower electrode LE2 may be disposed on the base layer BL and may overlap the second emission area PXA2. The second lower electrode LE2 may be disposed on the circuit element layer DP-CL. The second lower electrode LE2 may be an anode or cathode electrode.

The second lower electrode LE2 may include a second oxidation electrode IE2, a second reflective electrode RE2, and a second transparent oxide electrode TE2. The second lower electrode LE2 may have a stacked structure in which a second oxidation electrode IE2, a second reflective electrode RE2, and a second transparent oxide electrode TE2 are sequentially stacked on each other. The second lower electrode LE2 may be a resonance electrode. The second lower electrode LE2 shown in FIG. 5 shows the structure of the resonance electrode as an example, and the structure of the second lower electrode LE2 may not be limited thereto. The second lower electrode LE2 may have various structures according to needs, such as a design according to resonance.

The second oxidation electrode IE2 may include a transparent conductive oxide. The second oxidation electrode IE2 may include a same material as the second transparent oxide electrode TE2 or may include a different material. The second oxidation electrode IE2 may be omitted if necessary.

The second reflective electrode RE2 may be disposed on the second oxidizing electrode IE2. The second reflective electrode RE2 may include a metal material. For example, the second reflective electrode RE2 may be a reflective layer consisting of silver (Ag), magnesium (Mg), aluminum (Al), platinum (Pt), palladium (Pd), gold (Au), nickel (Ni), neodymium (Nd), iridium (Ir), Chromium (Cr), a compound thereof, or a combination thereof. For example, the second reflective electrode RE2 may include silver (Ag).

The second transparent oxide electrode TE2 may be disposed on the second reflective electrode RE2. The second transparent oxide electrode TE2 may include a transparent conductive oxide. For example, the second transparent oxide electrode TE2 may be a transparent or translucent electrode layer including at least one selected from the group consisting of indium tin oxide (ITO), indium zinc oxide (IZO), indium gallium zinc oxide (IGZO), zinc oxide (ZnO), indium oxide ($In_2O_3$), and aluminum doped zinc oxide (AZO). For example, the second transparent oxide electrode TE2 may be indium gallium zinc oxide (IGZO).

The third light emitting element ED3 may include a third lower electrode LE3, an auxiliary emission pattern EP2, and a second upper electrode UE2.

The third lower electrode LE3 may be disposed on the base layer BL and may overlap the third emission area PXA3. The third lower electrode LE3 may be disposed on the circuit element layer DP-CL. The third lower electrode LE3 may be an anode or cathode electrode.

The third lower electrode LE3 may include a third oxidation electrode IE3, a third reflective electrode RE3, and a third transparent oxide electrode TE3. The third lower electrode LE3 may have a stack structure in which a third oxidation electrode IE3, a third reflective electrode RE3, and a third transparent oxide electrode TE3 are sequentially stacked on each other. The third lower electrode LE3 may be a resonance electrode. The third lower electrode LE3 shown in FIG. 5 shows the structure of a resonance electrode as an example, and the structure of the third lower electrode LE3 may not be limited thereto. The third lower electrode LE3 may have various structures according to needs, such as a design according to resonance.

The third oxidation electrode IE3 may include a transparent conductive oxide. The third oxidation electrode IE3 may include a same material as the third transparent oxide electrode TE3 or may include a different material. The third oxidation electrode IE3 may be omitted if necessary.

The third reflective electrode RE3 may be disposed on the third oxidation electrode IE3. The third reflective electrode RE3 may include a metal material. For example, the third reflective electrode RE3 may be a reflective layer composed of silver (Ag), magnesium (Mg), aluminum (Al), platinum (Pt), palladium (Pd), gold (Au), nickel (Ni), neodymium (Nd), iridium (Ir), Chromium (Cr), a compound thereof, or a combination thereof. For example, the third reflective electrode RE3 may include silver (Ag).

The third transparent oxide electrode TE3 may be disposed on the third reflective electrode RE3. The third transparent oxide electrode TE3 may include a transparent conductive oxide. For example, the third transparent oxide electrode TE3 may be a transparent or translucent electrode layer including at least one selected from the group consisting of indium tin oxide (ITO), indium zinc oxide (IZO), indium gallium zinc oxide (IGZO), zinc oxide (ZnO), indium oxide ($In_2O_3$), and aluminum doped zinc oxide (AZO). For example, the third transparent oxide electrode TE3 may include indium gallium zinc oxide (IGZO).

The first sacrificial pattern SP1 may be disposed on the upper surface of the third lower electrode LE3. The first sacrificial pattern SP1 may be disposed on an outer region of the third lower electrode LE3. The first sacrificial pattern SP1 may define a first lower opening OP1-L exposing a portion of the upper surface of the third lower electrode LE3. The first sacrificial pattern SP1 may be disposed between the third lower electrode LE3 and the pixel defining film PDL.

The first sacrificial pattern SP1 may include an amorphous transparent conductive oxide. According to this disclosure, in the process of etching the first sacrificial pattern SP1 to form the first lower opening OP1-L, it may be possible to prevent the third lower electrode LE3 from being etched and damaged.

According to the embodiment, the third emission opening OP-E3 overlaps the first lower opening OP1-L in a plan view, and an area of the third emission opening OP-E3 may be smaller than an area of the first lower opening OP1-L. The inner surface of the pixel defining film PDL defining the third emission opening OP-E3 may be closer to the center of the third lower electrode LE3 than the inner surface of the first sacrificial pattern SP1 defining the first lower opening OP1-L. At this time, a portion of the pixel defining film PDL closer to the center of the third lower electrode LE3 than the inner surface of the first sacrificial pattern SP1 defining the first lower opening OP1-L may define a tip-portion TIP_PDL.

The auxiliary emission pattern EP2 may be disposed on the third lower electrode LE3 and may overlap the third emission area PXA3. The auxiliary emission pattern EP2 may be disposed inside the first upper opening OP1-U defined in the conductive bank CPW. The emission pattern auxiliary EP2 may cover a portion of the upper surface of the pixel defining film PDL exposed through the first upper opening OP1-U. The auxiliary emission pattern EP2 may be patterned by the tip-portion TIP_CPW defined on the conductive bank CPW.

In case of patterning the auxiliary emission pattern EP2 using a separate mask (e.g., FMM), to support a separate mask, a support spacer protruding from the bank must be provided. As the separate mask may be spaced apart from the base surface on which patterning may be performed by the height of the bank and the spacer, there may be a limitation in improving resolution.

Also, as the mask contacts the spacer, foreign material may remain on the spacer after the patterning process of the auxiliary emission pattern EP2, and the spacer may be damaged due to scratching of the mask. Accordingly, a defective display panel may be formed. In this disclosure, by patterning the auxiliary emission pattern EP2 and the common emission pattern EP1 without a separate mask in contact with the internal structure of the display panel DP, the display panel DP having improved reliability by reducing the defect rate may be provided. In this disclosure, a conductive bank CPW may not be disposed between the first light emitting element ED1 and the second light emitting element ED2, and therefore the resolution of the display panel DP may be higher than in case of the first to third light emitting elements ED1 to ED3 being formed using the conductive bank CPW.

The second upper electrode UE2 may be disposed on the auxiliary emission pattern EP2 and may contact a side of the conductive bank CPW. The second upper electrode UE2 may contact the inner surface of the first conductive layer CDL1 defining the first area OP1-U1 (see FIG. 8) of the first upper opening OP1-U. Through this, the second upper electrode UE2 may be electrically connected to the conductive bank CPW and receive a bias voltage through the conductive bank CPW. The second upper electrode UE2 may be patterned by a tip-portion TIP_CPW defined in the conductive bank CPW. The second upper electrode UE2 may cover the auxiliary emission pattern EP2. The second upper electrode UE2 may overlap the third emission area PXA3. As the second upper electrode UE2 may be electrically connected to the conductive bank CPW having a relatively large thickness, it may be possible to provide the first to third light emitting elements ED1, ED2, and ED3 having reduced driving resistance, while increasing luminous efficiency and increasing lifespan.

The first capping pattern CP1 may be disposed on the second upper electrode UE2 inside the first upper opening OP1-U. The first capping pattern CP1 may be patterned by a tip-portion TIP_CPW defined on the conductive bank CPW. According to an embodiment of this disclosure, the first capping pattern CP1 may be omitted.

A conductive bank CPW may be disposed on a pixel defining film PDL. The conductive bank CPW may surround the third emission area PXA3 in a plan view. The conductive bank CPW may not overlap the first non-emission area NPXA1, which may be an area between the first lower electrode LE1 and the second lower electrode LE2 of the non-emission area NPXA. The conductive bank CPW may overlap the second non-emission area NPXA2. A first upper opening OP1-U corresponding to the third emission area PXA3 may be defined by the conductive bank CPW. An auxiliary emission pattern EP2 may be disposed in the first upper opening OP1-U. The first upper opening OP1-U may correspond to the third emission opening OP-E3.

In this embodiment, the conductive bank CPW may include a first conductive layer CDL1 and a second conductive layer CDL2. Each of the first conductive layer CDL1 and the second conductive layer CDL2 may include a conductive material. The first conductive layer CDL1 may be disposed on the pixel defining film PDL and may have a first conductivity and a first thickness. The second conductive layer CDL2 may be disposed on the first conductive layer CDL1, have a second conductivity lower than the first conductivity, and have a second thickness smaller than the first thickness.

In the etching process, the etch rate of the first conductive layer CDL1 may be greater than an etch rate of the second conductive layer CDL2. The first conductive layer CDL1 may include a material having a higher etch selectivity than the second conductive layer CDL2.

In an embodiment, each of the first and second conductive layers CDL1 and CDL2 may include a metallic material. Also, in an embodiment, the second conductive layer CDL2 may include a material having a lower reflectance than the first conductive layer CDL1, and the display quality of the display panel DP may be improved by substantially reducing reflectance on the upper surface of the second conductive layer CDL2 forming the upper surface of the conductive bank CPW. For example, the first conductive layer CDL1 may include aluminum (Al), and the second conductive layer CDL2 may include titanium (Ti). However, the material of each of the first and second conductive layers CDL1 and CDL2 may not be limited to an embodiment.

In this embodiment, a conductive bank CPW may receive a bias voltage. Accordingly, a bias voltage may be provided to each of the first and second upper electrodes UE1 and UE2 in contact with the conductive bank CPW.

In this embodiment, in a plan view, the first upper opening OP1-U defined in the second conductive layer CDL2 overlaps the first upper opening OP1-U1 (see FIG. 8) defined in the first conductive layer CDL1, and an area of the first upper opening OP1-U2 defined in the second conductive layer CDL2 may be smaller than an area of the first upper opening OP1-U1 defined in the first conductive layer CDL1.

The thin film encapsulation layer TFE may include a first encapsulation inorganic pattern LIL1, a second encapsulation inorganic pattern LIL2, an encapsulation organic layer OL, and an encapsulation inorganic layer UIL. The thin film encapsulation layer TFE may protect the display element layer DP-OLED from foreign substances such as moisture, oxygen and dust particles. The thin film encapsulation layer TFE may include at least one inorganic film and at least one organic film.

The first encapsulation inorganic pattern LIL1 may cover the first upper electrode UE1 and overlap the first emission area PXA1 and the second emission area PXA2. The first encapsulation inorganic pattern LIL1 may cover the first light emitting element ED1 and the second light emitting element ED2. The first encapsulation inorganic pattern LIL1 may contact a side of the first conductive layer CDL1. The first encapsulation inorganic pattern LIL1 may cover an area of the first dummy pattern DMP1.

The first encapsulation inorganic pattern LIL1 may protect the first light emitting element ED1 and the second light emitting element ED2 from moisture/oxygen. The first encapsulation inorganic pattern LIL1 may include silicon nitride, silicon oxynitride, silicon oxide, titanium oxide, aluminum oxide, or a combination thereof. However, the first encapsulation inorganic pattern LIL1 may not be limited thereto and may include various other materials.

The second encapsulation inorganic pattern LIL2 may cover the second upper electrode UE2 and overlap the third emission area PXA3. The second encapsulation inorganic pattern LIL2 may cover the third light emitting element ED3. The second encapsulation inorganic pattern LIL2 may contact a side of the first conductive layer CDL1. The second encapsulation inorganic pattern LIL2 may cover an area of the second dummy pattern DMP2.

The second encapsulation inorganic pattern LIL2 may protect the third light emitting element ED3 from moisture/oxygen. The second encapsulation inorganic pattern LIL2 may include silicon nitride, silicon oxynitride, silicon oxide, titanium oxide, aluminum oxide, or a combination thereof. However, the second encapsulation inorganic pattern LIL2 may not be limited thereto and may include various other materials.

The encapsulation organic layer OL may cover the first encapsulation inorganic pattern LIL1 and the second encapsulation inorganic pattern LIL2. The encapsulation organic layer OL may have an approximately flat upper surface. The encapsulation organic layer OL may protect the first to third light emitting elements ED1, ED2, and ED3 from foreign material such as dust particles. The encapsulation organic layer OL may include an acryl-based compound or an epoxy-based compound. The encapsulation organic layer may include a photopolymerizable organic material and may not be particularly limited.

The encapsulation inorganic layer UIL may be disposed on the encapsulation organic layer OL to cover the encapsulation organic layer OL. The encapsulation inorganic layer UIL may protect the first to third light emitting elements ED1, ED2, and ED3 from moisture/oxygen.

Each of the color filters CF1, CF2, and CF3 may be disposed on the thin film encapsulation layer TFE. The first color filter CF1 corresponds to the first emission area PXA1, the second color filter CF2 corresponds to the second emission area PXA2, and the third color filter CF3 corresponds to the third emission area PXA3. Although not shown, a light blocking portion (not shown) disposed between each of the color filters CF1, CF2, and CF3 may be further included. The light blocking portion may be a black matrix. The light blocking portion may include an organic light blocking material or an inorganic light blocking material including a black pigment or a black dye. The light blocking portion may prevent light leakage and distinguish boundaries between adjacent filters CF1, CF2, and CF3.

Each of the first to third color filters CF1, CF2, and CF3 may include a polymer photoresist and a colorant. In this specification, the colorant may include pigments and dyes. The red colorant includes a red pigment and a red dye, the green colorant includes a green pigment and a green dye, and the blue colorant includes a blue pigment and a blue dye.

Figure 6:
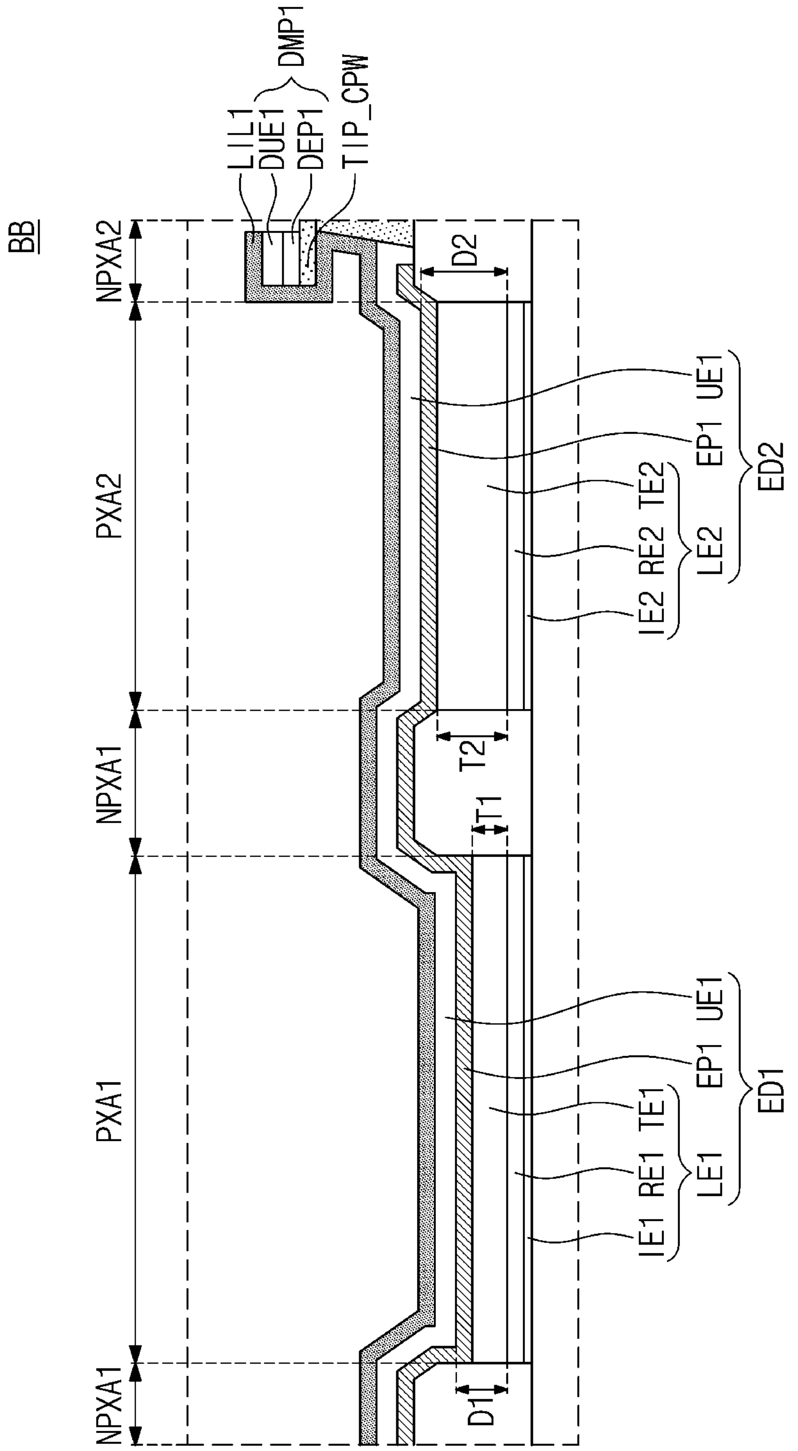
FIG. 6 is an enlarged schematic cross-sectional view of the BB area of FIG. 5 according to an embodiment of this disclosure.

FIG. 6 is an enlarged schematic cross-sectional view of the BB area of FIG. 5 according to an embodiment of this disclosure. Referring to FIG. 6, it may be confirmed that the thicknesses of the first transparent oxide electrode TE1 and the second transparent oxide electrode TE2 may be different. A thickness T1 of the first transparent oxide electrode TE1 may be smaller than a thickness T2 of the second transparent oxide electrode TE2. A separation distance D1 between the first reflective electrode RE1 and the first upper electrode UE1 may be smaller than a separation distance D2 between the second reflective electrode RE2 and the first upper electrode UE1. Accordingly, the display panel DP (see FIG. 5) according to an embodiment of this disclosure may be arbitrarily designed to generate an optimal resonance frequency that causes light resonance of a specific wavelength of each of the first and second light emitting elements ED1 and ED2. The thickness T1 of the first transparent oxide electrode TE1 and the thickness T2 of the second transparent oxide electrode TE2 may be provided so that the red light, the green light, or the blue light has an n-order resonance.

For example, by adjusting the thickness T1 of the first transparent oxide electrode TE1 of the first light emitting element ED1, the light output by the first filter CF1 (see FIG. 5) may have a primary resonance. By adjusting the thickness T2 of the second transparent oxide electrode TE2 of the second light emitting element ED2, the light output by the second filter CF2 (see FIG. 5) may have secondary resonance. As a result, the display panel DP (see FIG. 5) according to an embodiment of this disclosure may exhibit excellent display resolution and improved display lifespan.

The first dummy pattern DMP1 may be disposed on a side of the upper surface of the second conductive layer CDL2 (see FIG. 5). The first dummy pattern DMP1 may include a dummy common emission pattern DEP1 and a dummy first upper electrode DUE1.

The dummy common emission pattern DEP1 may be disposed on the top surface of the second conductive layer CDL2 (see FIG. 5). The dummy common emission pattern DEP1 may be formed by a same process as the common emission pattern EP1, have a same structure, and include a same material. The dummy common emission pattern DEP1 may be spaced apart from the common emission pattern EP1. The dummy common emission pattern DEP1 may correspond to a material from a same layer as the common emission pattern EP1 but separated from the common emission pattern EP1 due to the topography of the conductive bank CPW in case that the common emission pattern EP1 is formed.

The dummy first upper electrode DUE1 may be disposed on the dummy common emission pattern DEP1. The dummy first upper electrode DUE1 may be formed by a same process as the first upper electrode UE1, have a same structure, and include a same material. The dummy first upper electrode DUE1 may be spaced apart from the first upper electrode UE1. The dummy first upper electrode DUE1 may correspond to material from a same layer as the first upper electrode UE1 but separated from the dummy first upper electrode UE1 due to the topography of the conductive bank CPW in case that the first upper electrode UE1 is formed.

Since the common emission pattern EP1 provided as the common layer may be deposited without a mask, a pixel with a smaller area may be formed. In the display panel DP (see FIG. 5) according to an embodiment, a large number of pixels having a smaller area are disposed in a plan view, so that high resolution may be realized.

Figure 7:
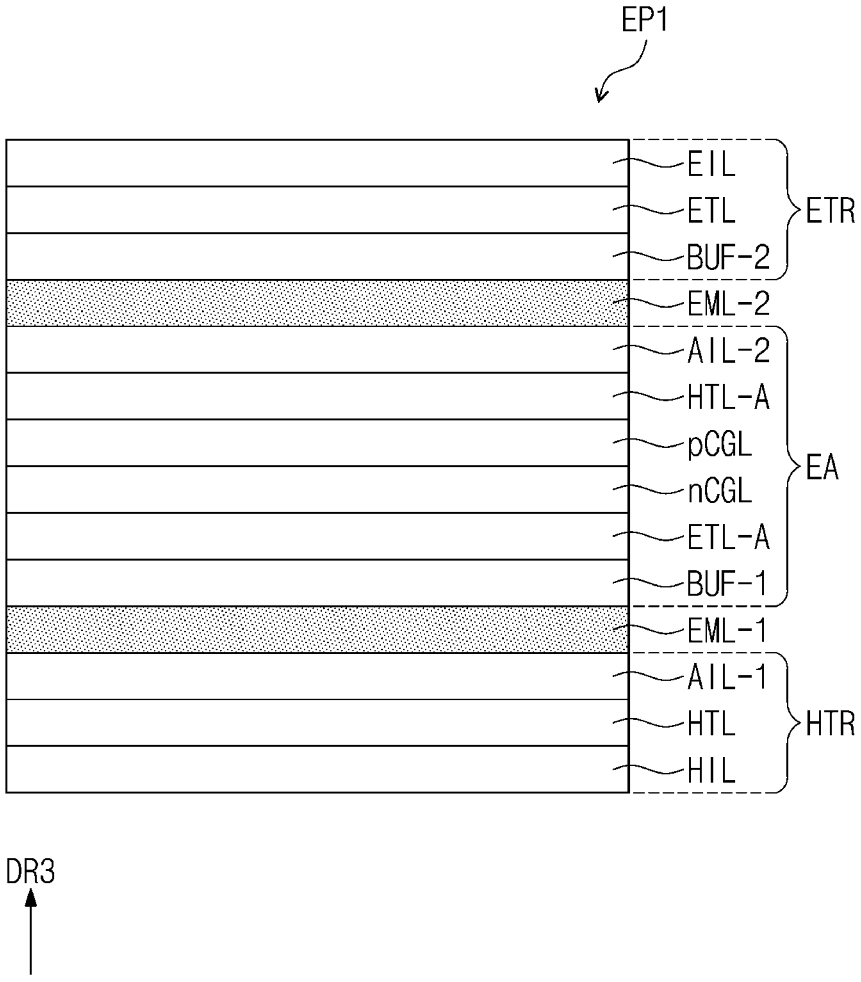
FIG. 7 is a schematic cross-sectional view of a common light emitting layer according to an embodiment of this disclosure.

FIG. 7 is a schematic cross-sectional view of a common emission pattern EP1 according to an embodiment of this disclosure. Referring to FIG. 7, the common emission pattern EP1 may include a hole transport region HTR, a first color light emitting layer EML-1, a light emitting auxiliary part EA, a second color light emitting layer EML-2, and an electron transport region ETR. In the first light emitting element ED1 and the second light emitting element ED2, the hole transport region HTR, the first color light emitting layer EML-1, the light emitting auxiliary part EA, the second color light emitting layer EML-2, and the electron transport region ETR may be provided as a common layer. The common emission pattern EP1 may include a first color light emitting layer EML-1 and a second color light emitting layer EML-2 that generate light of different wavelength regions. The thickness of each of the hole transport region HTR, the light emitting auxiliary part EA, and the electron transport region ETR of the common emission pattern EP1 may be provided so that red light, green light, or blue light has an n-order resonance.

In the common emission pattern EP1, the hole transport region HTR may be provided on the first lower electrode LE1 (see FIG. 6) and the second lower electrode LE2 (see FIG. 6). The hole transport region HTR may have a multi-layer structure including a single layer made of a single material, a single layer made of multiple different materials, or multiple layers made of multiple different materials. For example, the hole transport region HTR may include a phthalocyanine compound such as copper phthalocyanine, DNTPD(N1,N1'-([1,1'-biphenyl]-4,4'-diyl)bis(N1-phenyl-N4,N4-di-m-tolylbenzene-1,4-diamine)), m-MTDATA(4,4',4"-[tris(3-methylphenyl)phenylamino]triphenylamine), TDATA(4,4'4"-Tris(N,N-diphenylamino)triphenylamine), 2-TNATA(4,4',4"-tris[N(2-naphthyl)-N-phenylamino]-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS(Polyaniline/Poly(4-styrenesulfonate)), NPB(N,N'-di(naphthalene-1-yl)-N,N'-diphenyl-benzidine), polyetherketone including triphenylamine (TPAPEK), 4-Isopropyl-4'-methyldiphenyliodonium[Tetrakis(pentafluorophenyl)borate], HATCN (dipyrazino[2,3-f: 2',3'-h]quinoxaline-2,3,6,7,10,11-hexacarbonitrile), the like, or a combination thereof.

The hole transport region HTR may include carbazole derivatives such as N-phenylcarbazole and polyvinylcarbazole, fluorene derivatives, TPD (N,N'-bis(3-methylphenyl)-N,N'-diphenyl-[1,1' Triphenylamine-based derivatives such as-biphenyl]-4,4'-diamine), TCTA (4,4',4"-tris(N-carbazolyl)triphenylamine), TAPC (4,4'-Cyclohexylidene bis[N,N-bis(4-methylphenyl)benzenamine]), HMTPD(4,4'-Bis[N,N'-(3-tolyl)amino]-3,3'-dimethylbiphenyl), CzSi(9-(4-tert-Butylphenyl)-3,6-bis(triphenylsilyl)-9H-carbazole), CCP(9-phenyl-9H-3,9'-bicarbazole), mCP(1,3-Bis(N-carbazolyl)benzene), mDCP (1,3-bis(1,8-dimethyl-9H-carbazol-9-yl)benzene), or a combination thereof.

The hole transport region HTR may further include a charge generating material to improve conductivity in addition to the above-mentioned material. The charge generating material may be uniformly or non-uniformly dispersed in the hole transport region HTR. The charge generating material may be, for example, a p-dopant. The p-dopant may include at least one of a metal halide compound, a quinone derivative, a metal oxide, and a cyano group-containing compound, but may not be limited thereto. For example, the p-dopant may include a metal halide compound such as CuI and RbI, a quinone derivative such as Tetracyanoquinodimethane (TCNQ) and F4-TCNQ (2,3,5,6-tetrafluoro-7,7'8,8-tetracyanoquinodimethane), a metal oxide such as tungsten oxide and molybdenum oxide, a cyano group-containing compound such as HATCN (dipyrazino[2,3-f: 2',3'-h]quinoxaline-2,3,6,7,10,11-hexacarbonitrile) and NDP9 (4-[[2,3-bis[cyano-(4-cyano-2,3,5,6-tetrafluorophenyl)methylidene]cyclopropylidene]-cyanomethyl]-2,3,5,6-tetrafluorobenzonitrile), the like, or a combination thereof, but the embodiment may not be limited thereto.

The hole transport region HTR may include a hole injection layer HIL, a first hole transport layer HTL, and a first sub-hole control layer AIL-1 sequentially stacked on each other. Unlike the drawing, at least one of the hole injection layer HIL, the first hole transport layer HTL, and the first sub-hole control layer AIL-1 may be omitted. The hole injection layer HIL, the first hole transport layer HTL, and the first sub-hole control layer AIL-1 may include the compounds of the hole transport region HTR described above. The first sub-hole control layer AIL-1 may be disposed adjacent to the first color light emitting layer EML-1 generating the first light. The first sub-hole control layer AIL-1 may be formed to have a highest occupied molecular orbital (HOMO) energy level and a lowest unoccupied molecular orbital (LUMO) energy level through which holes may readily move. Accordingly, the light emitting element ED including the first sub-hole control layer AIL-1 may prevent an increase in the driving voltage. Also, the first sub-hole control layer AIL-1 may block electrons moving from the first color light emitting layer EML-1 to the hole transport region HTR. Therefore, the display panel DP (see FIG. 5) including the common emission pattern EP1 including the first sub-hole control layer AIL-1 may have an improved display lifetime.

The electron transport region ETR may be provided on the light emitting auxiliary part EA. The electron transport region ETR may have a multilayer structure including a single layer made of a single material, a single layer made of multiple different materials, or multiple layers made of multiple different materials.

For example, the electron transport region ETR may include an anthracene-based compound. However, this disclosure may not be limited thereto, and the electron transport region ETR may include Alq3(Tris(8-hydroxyquinolinato) aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, TPBi(1,3,5-Tri(1-phenyl-1H-benzo[d]imidazol-2-yl)benzene), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate)), ADN(9,10-di(naphthalene-2-yl)anthracene), BmPyPhB(1,3-Bis[3,5-di(pyridin-3-yl)phenyl]benzene), a mixture thereof, or a combination thereof.

The electron transport region ETR may include a metal halide such as LiF, NaCl, CsF, RbCl, RbI, CuI, and KI, a lanthanide metal such as Yb, and a co-deposition material of the above metal halide and the lanthanide metal. For example, the electron transport region ETR may include KI:Yb, RbI:Yb, LiF:Yb, the like, or a combination thereof as a co-deposited material. For the electron transport region ETR, a metal oxide such as Li2O or BaO, or 8-hydroxyl-Lithium quinolate (Liq) may be used, but the embodiment may not be limited thereto. The electron transport region ETR may also be made of a mixture of an electron transport material and an insulating organometallic salt. The organometallic salt may be a material having an energy band gap of about 4 eV or more. Specifically and for example, organometallic salt may include metal acetate, metal benzoate, metal acetoacetate, metal acetylacetonate, metal stearate, or a combination thereof.

The electron transport region ETR may further include at least one of BCP(2,9-dimethyl-4,7-diphenyl-1,10-phenanthroline), TSPO1(diphenyl(4-(triphenylsilyl)phenyl) phosphine oxide), and Bphen(4,7-diphenyl-1,10-phenanthroline), but the embodiment may not be limited thereto. The electron transport region ETR may include a second buffer layer BUF-2, a first electron transport layer ETL, and an electron injection layer EIL sequentially stacked on each other. Unlike the drawing, at least one of the second buffer layer BUF-2, the first electron transport layer ETL, and the electron injection layer EIL may be omitted. The second buffer layer BUF-2, the first electron transport layer ETL, and the electron injection layer EIL may include the aforementioned compounds of the electron transport region ETR. The second buffer layer BUF-2 may block holes moving from the second color light emitting layer EML-2 to the electron transport region ETR.

The light emitting auxiliary part EA disposed between the first color light emitting layer EML-1 and the second color light emitting layer EML-2 may include a first buffer layer BUF-1, a second electron transport layer ETL-A, a first charge generation layer nCGL, a second charge generation layer pCGL, a second hole transport layer HTL-A, and a second sub-hole control layer AIL-2 sequentially stacked on each other. The first charge generation layer nCGL may be an n-type charge generation layer, and the second charge generation layer pCGL may be a p-type charge generation layer. Unlike FIG. 7, at least one of the first buffer layer BUF-1, the second electron transport layer ETL-A, the first charge generation layer nCGL, the second charge generation layer pCGL, the second hole transport layer HTL-A, and the second sub-hole control layer AIL-2 may be omitted.

The second sub-hole control layer AIL-2 may include a material different from that of the first sub-hole control layer AIL-1 described above. The second sub-hole control layer AIL-2 may include a material that helps the second color light emitting layer EML-2 to generate the second light. The first sub-hole control layer AIL-1 may include a material that helps the first color light emitting layer EML-1 to generate the first light. However, the embodiment may not be limited thereto, and the first sub-hole control layer AIL-1 and the second sub-hole control layer AIL-2 may include a same material.

The second sub-hole control layer AIL-2 may be disposed adjacent to the second color light emitting layer EML-2 generating second light. The second sub-hole control layer AIL-2 may be formed to have a highest occupied molecular orbital (HOMO) energy level and a lowest unoccupied molecular orbital (LUMO) energy level through which holes may readily move. Accordingly, the light emitting elements ED1 and ED2 (see FIG. 5) including the second sub-hole control layer AIL-2 may prevent an increase in driving voltage. Also, the second sub hole control layer AIL-2 may block electrons moving from the second color light emitting layer EML-2 to the second hole transport layer HTL-A. Accordingly, the display panel DP (see FIG. 5) including the common emission pattern EP1 including the second sub-hole control layer AIL-2 may have an improved display lifetime.

FIG. 8 is an enlarged schematic cross-sectional view of a region CC of FIG. 5 according to an embodiment of this disclosure. Referring to FIG. 8, detailed structures of the third light emitting element ED3, the conductive bank CPW, and the second dummy pattern DMP2 are shown. A description of same configuration described in FIG. 5 will be omitted.

In the schematic cross section of FIG. 8, the first upper opening OP1-U may include a first area OP1-U1 defined by the inner surface of the first conductive layer CDL1 and a second area OP1-U2 defined by the inner surface of the second conductive layer CDL2. In the schematic cross section of FIG. 8, the width of the first area OP1-U1 may be greater than a width of the second area OP1-U2. In the schematic cross section of FIG. 8, the inner surface of the second conductive layer CDL2 defining the second area OP1-U2 may be closer to the center of the third lower electrode LE3 than the inner surface of the first conductive layer CDL1 defining the first area OP1-U1. In this disclosure, in relation to the conductive bank CPW, a portion of the second conductive layer CDL2 closer to the center of the first lower electrode LE1 than the inner surface of the first conductive layer CDL1 defining the first area OP1-U1 may be defined as a tip-portion TIP_CPW.

According to an embodiment, the area of the first upper opening OP1-U1 defined in the first conductive layer CDL1 in a plan view may be larger than the area of the first emission opening OP1-E defined in the pixel defining film PDL, and the first conductive layer CDL1 may expose a portion of the upper surface of the pixel defining film PDL through the first upper opening OP1-U1.

The second dummy pattern DMP2 may include a dummy auxiliary emission pattern DEP2, a dummy second upper electrode DUE2, and a first dummy capping pattern DCP1. The dummy auxiliary emission pattern DEP2 may be disposed on the second conductive layer CDL2. The dummy auxiliary emission pattern DEP2 may be formed by a same process as the auxiliary emission pattern EP2, have a same structure, and include a same material. The dummy auxiliary emission pattern DEP2 may be spaced apart from the auxiliary emission pattern EP2. The dummy auxiliary emission pattern DEP2 may correspond to material from a same layer as the auxiliary emission pattern EP2 but separated from the auxiliary emission pattern EP2 due to the topography of the conductive bank CPW in case that the auxiliary emission pattern EP2 may be formed.

The dummy second upper electrode DUE2 may be disposed on the dummy auxiliary emission pattern DEP2. The dummy second upper electrode DUE2 may be formed by a same process as the second upper electrode UE2, have a same structure, and include a same material. The dummy second upper electrode DUE2 may be spaced apart from the second upper electrode UE2. The dummy second upper electrode DUE2 may correspond to material from a same layer as the second upper electrode UE2 but separated from the second upper electrode UE2 due to the topography of the conductive bank CPW in case that the second upper electrode UE2 may be formed.

The dummy first capping pattern DCP1 may be disposed on the dummy second upper electrode DUE2. The dummy first capping pattern DCP1 may be formed by a same process as the first capping pattern CP1, have a same structure, and include a same material. The dummy first capping pattern DCP1 may be spaced apart from the first capping pattern CP1. The dummy first capping pattern DCP1 may correspond to material from a same layer as the first capping pattern CP1 but separated from the first capping pattern CP1 due to the topography of the conductive bank CPW in case that the first capping pattern CP1 may be formed.

Figure 9:
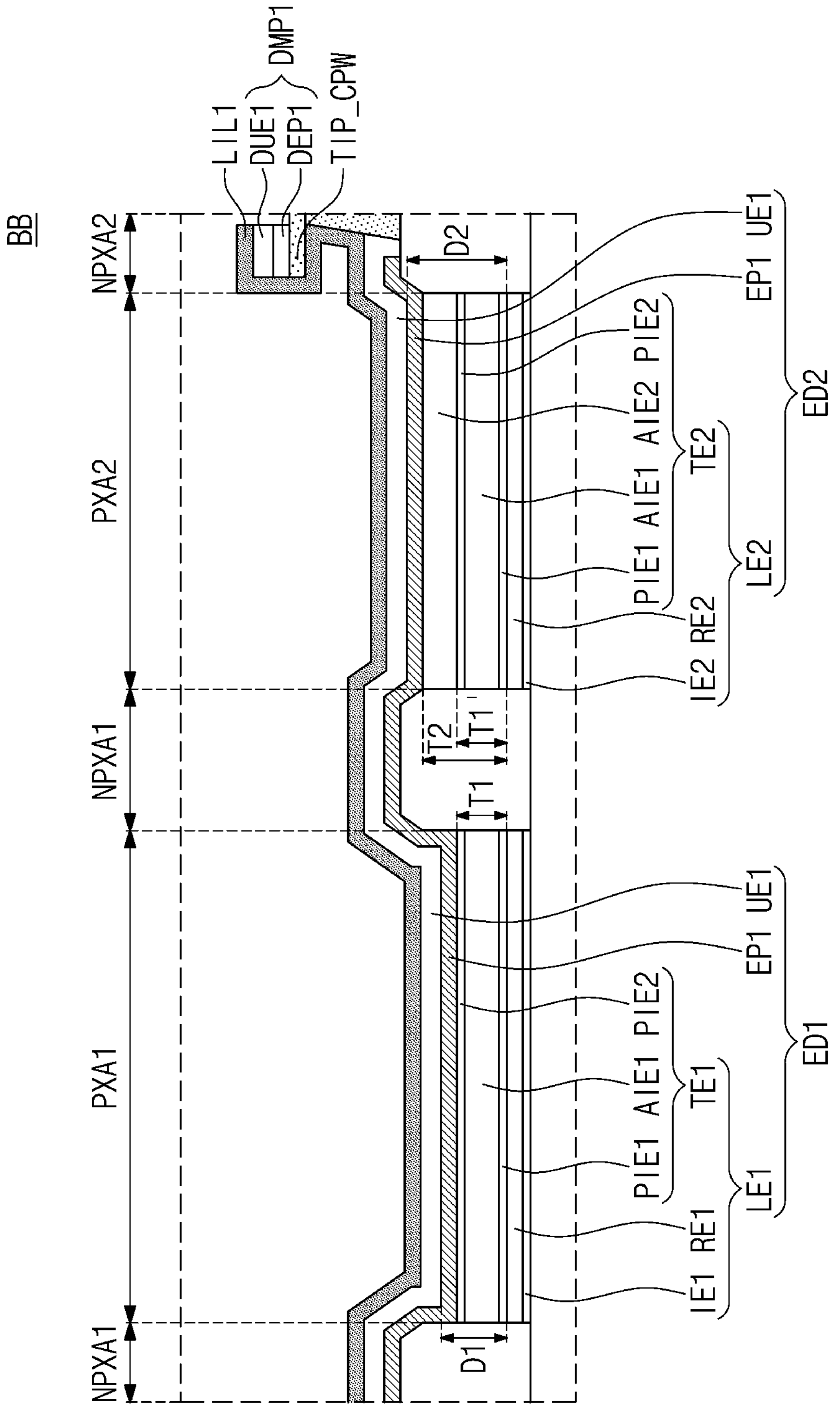
FIG. 9 is an enlarged schematic cross-sectional view of the BB area of FIG. 5 according to an embodiment of this disclosure.

FIG. 9 is an enlarged schematic cross-sectional view of the BB area of FIG. 5 according to an embodiment of this disclosure. Referring to FIG. 9, since the structures described in FIG. 6 are identical except for the structures of the first transparent oxide electrode TE1 and the second transparent oxide electrode TE2, description of same structures is omitted.

The first transparent oxide electrode TE1 may include a first crystallized region PIE1, a first amorphous region AIE1, and a second crystallized region PIE2. The first crystallized region PIE1 may be disposed on the first reflective electrode RE1. The first crystallized region PIE1 may be disposed on the first reflective electrode RE1 to protect the first reflective electrode RE1. The first amorphous region AIE1 may be disposed on the first crystallized region PIE1. The thickness of the first amorphous region AIE1 may be greater than a thickness of the first crystallized region PIE1. The second crystallized region PIE2 may be disposed on the first amorphous region AIE1. The first crystallized region PIE1 and the second crystallized region PIE2 may include a material crystallized at a lower temperature than the first amorphous region AIE1.

For example, the first crystallized region PIE1 and the second crystallized region PIE2 may include indium tin oxide (Poly-ITO). The first amorphous region AIE1 may include indium gallium zinc oxide (IGZO). The first crystallized region PIE1 and the second crystallized region PIE2 may have a smaller etching rate for an etchant in wet-etching than the first amorphous region AIE1.

The second transparent oxide electrode TE2 may include a first crystallized region PIE1, a first amorphous region AIE1, a second crystallized region PIE2, and a second amorphous region AIE2. The second transparent oxide electrode TE2 may further include a second amorphous region AIE2 compared to the first transparent oxide electrode TE1. The second amorphous region AIE2 may include a same material as the first amorphous region AIE1. The thickness T1 of the first transparent oxide electrode TE1 may be a same as the thickness T1' including the first crystallized region PIE1, the first amorphous region AIE1, and the second crystallized region PIE2 of the second transparent oxide electrode TE2.

Figure 10:
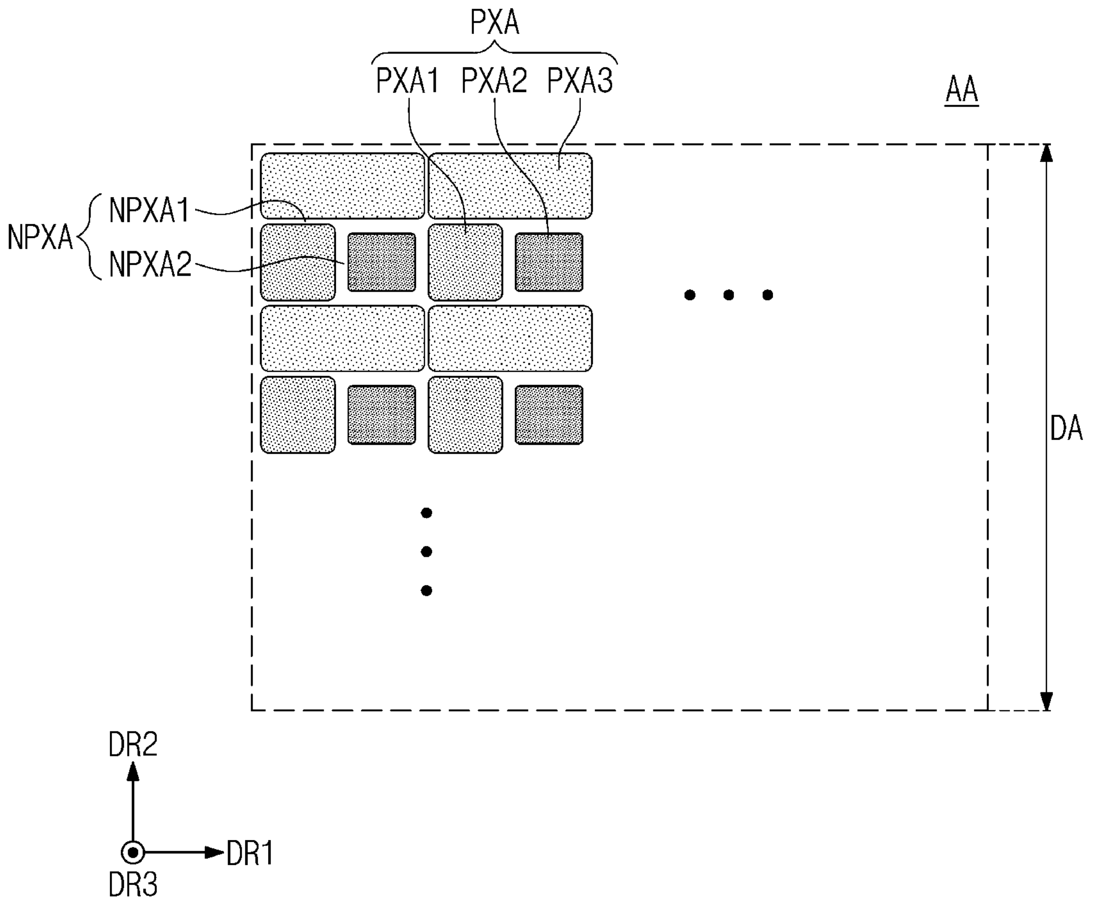
FIG. 10 is an enlarged plan view of an area AA of FIG. 2 according to an embodiment of this disclosure.
Figure 11:
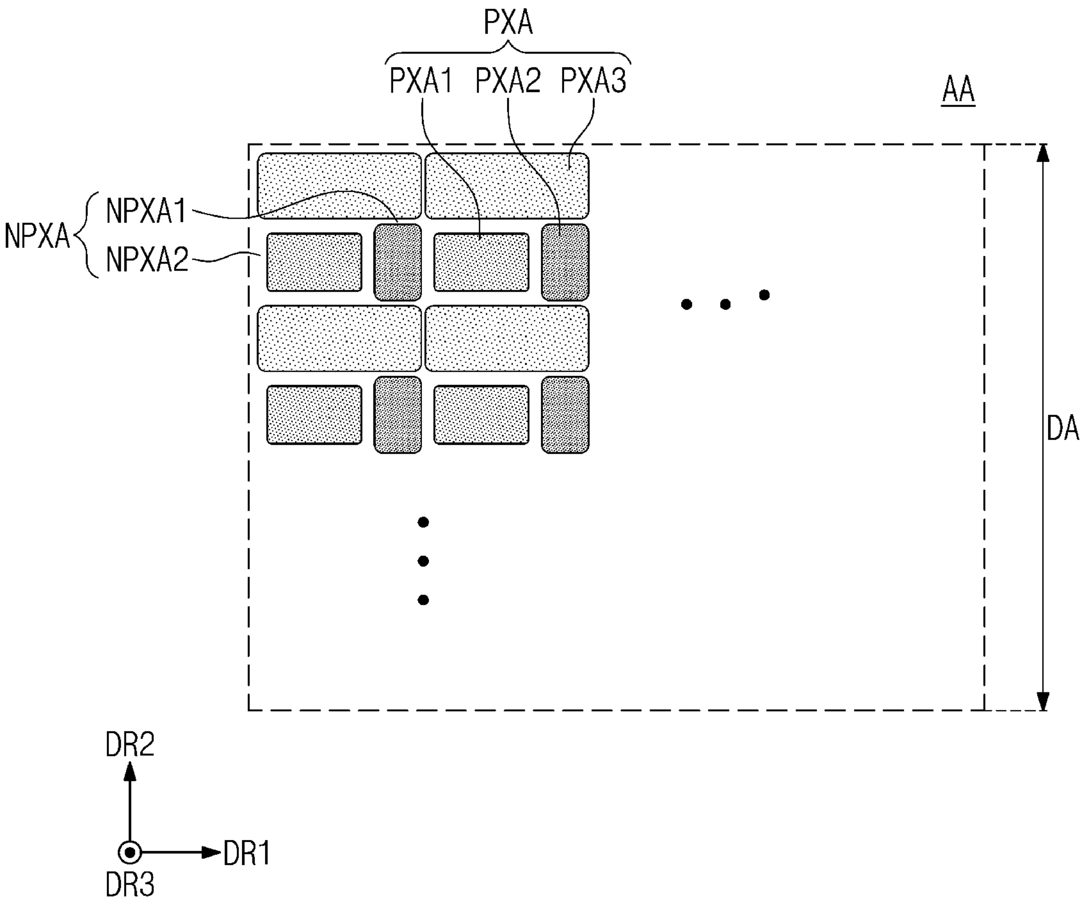
FIG. 11 is an enlarged plan view of an area AA of FIG. 2 according to an embodiment of this disclosure.

FIG. 10 is an enlarged plan view of an area AA of FIG. 2 according to an embodiment of this disclosure, and FIG. 11 is an enlarged plan view of an area AA of FIG. 2 according to an embodiment of this disclosure. Referring to FIGS. 10 and 11, the arrangement of emission areas PXA1, PXA2, and PXA3 and non-emission areas NPXA1 and NPXA2 may vary as needed. Referring to FIG. 10, the second non-emission area NPXA2 corresponding to the conductive bank CPW (see FIG. 5) may surround the second emission area PXA2. The first non-emission area NPXA1 may be disposed between the first emission area PXA1 and the third emission area PXA3.

Referring to FIG. 11, the second non-emission area NPXA2 corresponding to the conductive bank CPW (see FIG. 5) may surround the first emission area PXA1. The first non-emission area NPXA1 may be disposed between the second emission area PXA2 and the third emission area PXA3. In such a way, it is determined which emission area among the first to third emission areas PXA1, PXA2, and PXA3 is to be surrounded and a conductive bank CPW (see FIG. 5) is to be formed by comprehensively considering process productivity, required pixel arrangement, and resolution.

Figure 12A:
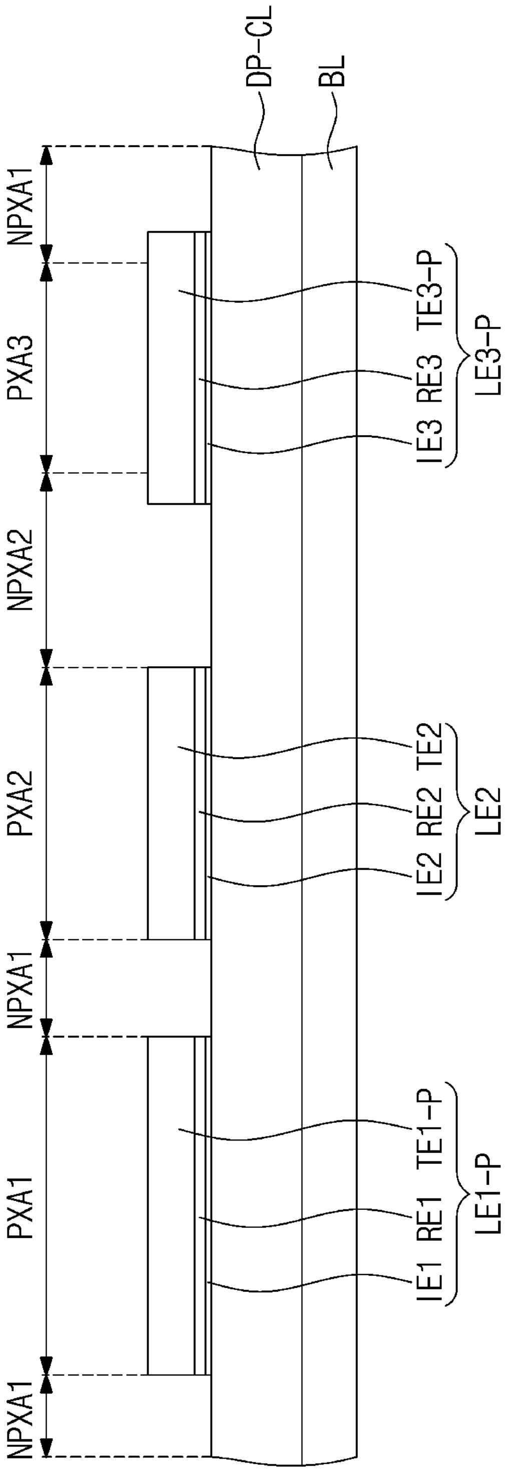
FIGS. 12A to 12L are schematic cross-sectional views sequentially illustrating some steps of a method for manufacturing a display device according to an embodiment of this disclosure.

FIGS. 12A to 12K are schematic cross-sectional views sequentially illustrating some operations of a method of manufacturing a display device DD (see FIG. 1) according to an embodiment of this disclosure. Referring to FIG. 12A, a preliminary first lower electrode LE1-P, a second lower electrode LE2, and a preliminary third lower electrode LE3-P may be formed on the base layer BL including first to third emission areas PXA1, PXA2, and PXA3 and non-emission areas NPXA. The preliminary first lower electrode LE1-P may overlap the first emission area PXA1. The second lower electrode LE2 may overlap the second emission area PXA2. The preliminary third lower electrode LE3-P may overlap the third emission area PXA3. The preliminary first lower electrode LE1-P may have a structure in which a first oxidation electrode IE1, a first reflective electrode RE1, and a preliminary first transparent oxide electrode TE1-P are sequentially stacked on each other. The second lower electrode LE2 may have a structure in which a second oxidation electrode IE2, a second reflective electrode RE2, and a second transparent oxide electrode TE2 are sequentially stacked on each other. The third lower electrode LE3 may have a structure in which a third oxidation electrode IE3, a third reflective electrode RE3, and a preliminary third transparent oxide electrode TE3-P are sequentially stacked on each other.

Figure 12B:
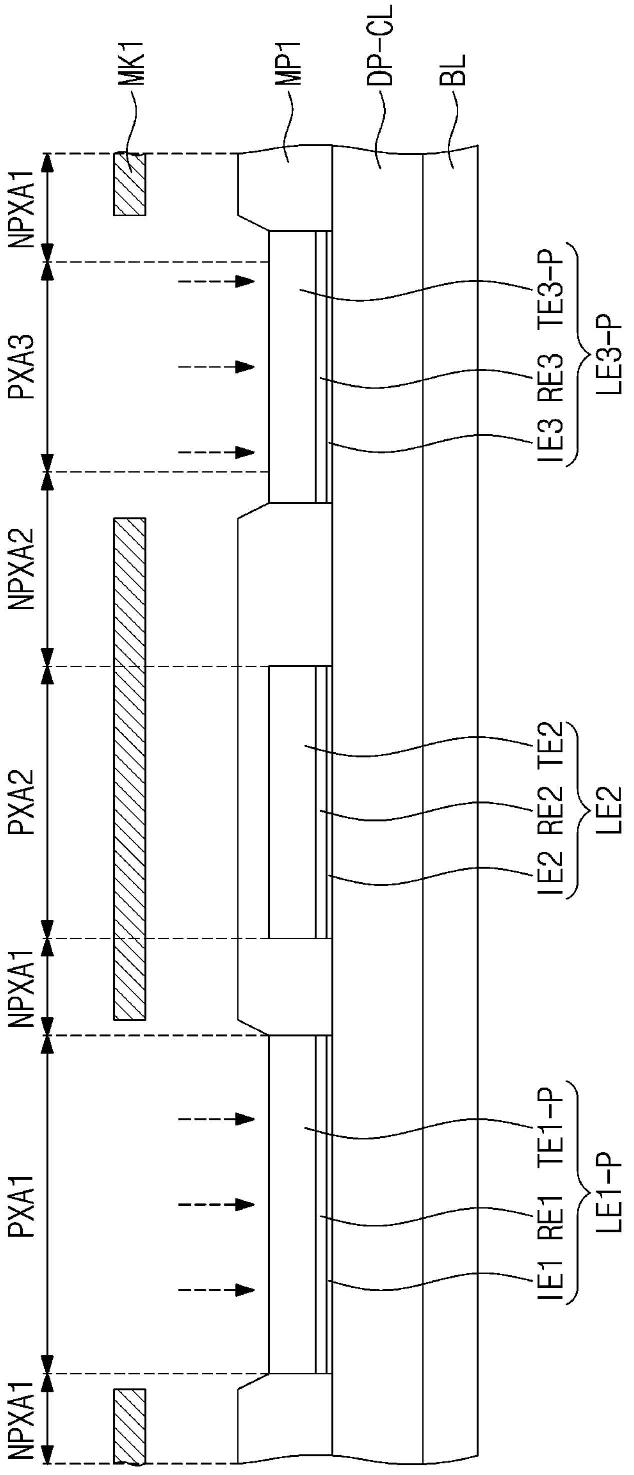

Referring to FIG. 12B, a first mask pattern MP1 may be formed on the circuit element layer DP-CL. Openings corresponding to each of the first emission area PXA1 and the third emission area PXA3 may be formed in the first mask pattern MP1. The photoresist process may be performed using the first mask MK1 having openings corresponding to the first emission area PXA1 and the third emission area PXA3 respectively. Photoresist may be used as the first mask pattern MP1. An exposure and developing process may be performed on the first mask pattern MP1 to form openings corresponding to the first emission area PXA1 and the third emission area PXA3, respectively.

Figure 12C:
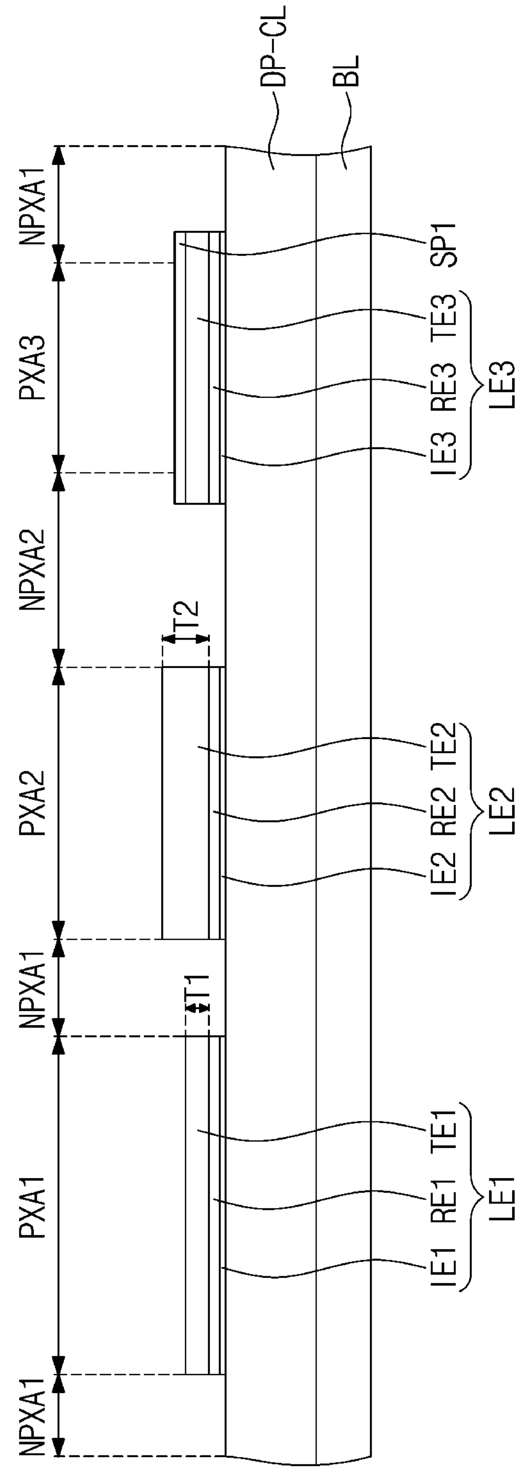

Referring to FIGS. 12B and 12C, after the photoresist process, the preliminary first lower electrode LE1-P and the preliminary third lower electrode LE3-P are etched through an etching process to form the first lower electrode LE1 and the third lower electrode LE3. The preliminary first transparent oxide electrode TE1-P of the preliminary first lower electrode LE1-P may be wet-etched. The preliminary third transparent oxide electrode TE3-P of the preliminary third lower electrode LE3-P may be wet-etched. Accordingly, the thickness T1 of the first transparent oxide electrode TE1 may be smaller than the thickness T2 of the second transparent oxide electrode TE2. A first capping pattern CP1 may be formed on the third lower electrode LE3. The base layer BL and the first lower electrode LE1, the second lower electrode LE2, and the third lower electrode LE3 disposed on the base layer BL may be defined as a preliminary display device.

Figure 12D:
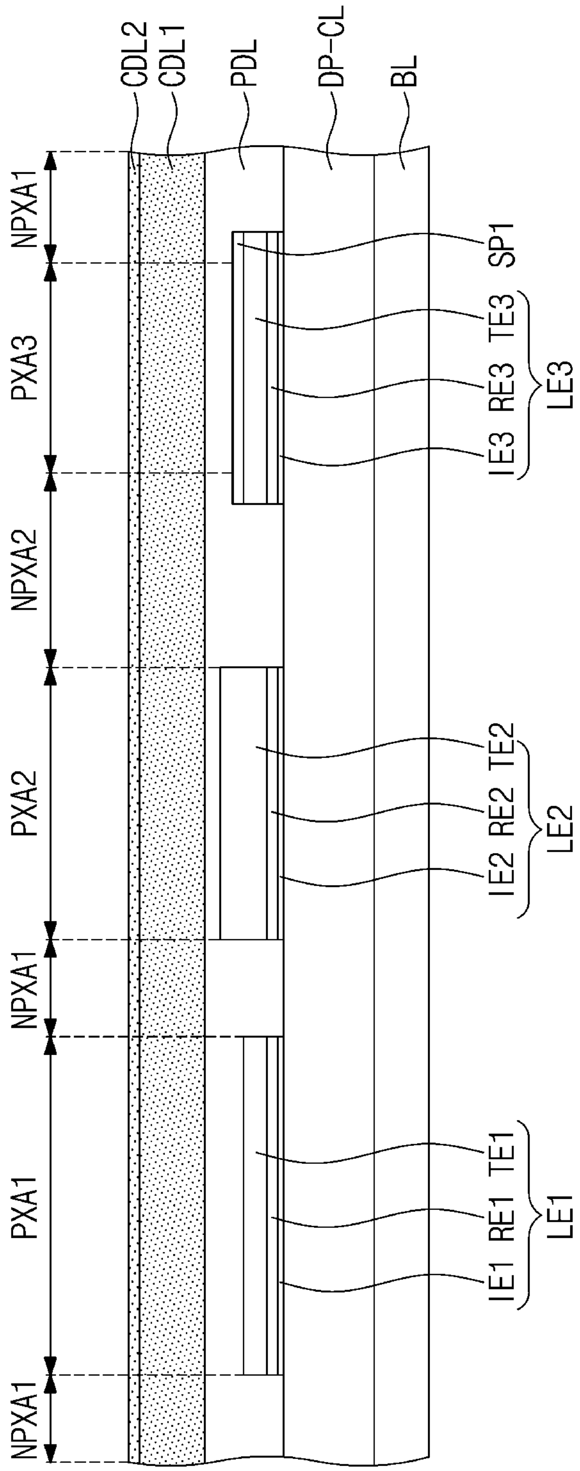

Referring to FIG. 12D, a pixel defining film PDL may be formed on the preliminary display device. A pixel defining film PDL may be disposed on the base layer BL and cover the first to third lower electrodes LE1, LE2, and LE3. A first conductive layer CDL1 and a second conductive layer CDL2, which are preliminary conductive bank layers, may be formed on the pixel defining film PDL. The thickness of the first conductive layer CDL1 may be greater than a thickness of the second conductive layer CDL2. The first conductive layer CDL1 may have a first conductivity, and the second conductive layer CDL2 may have a second conductivity lower than the first conductivity.

Figure 12E:
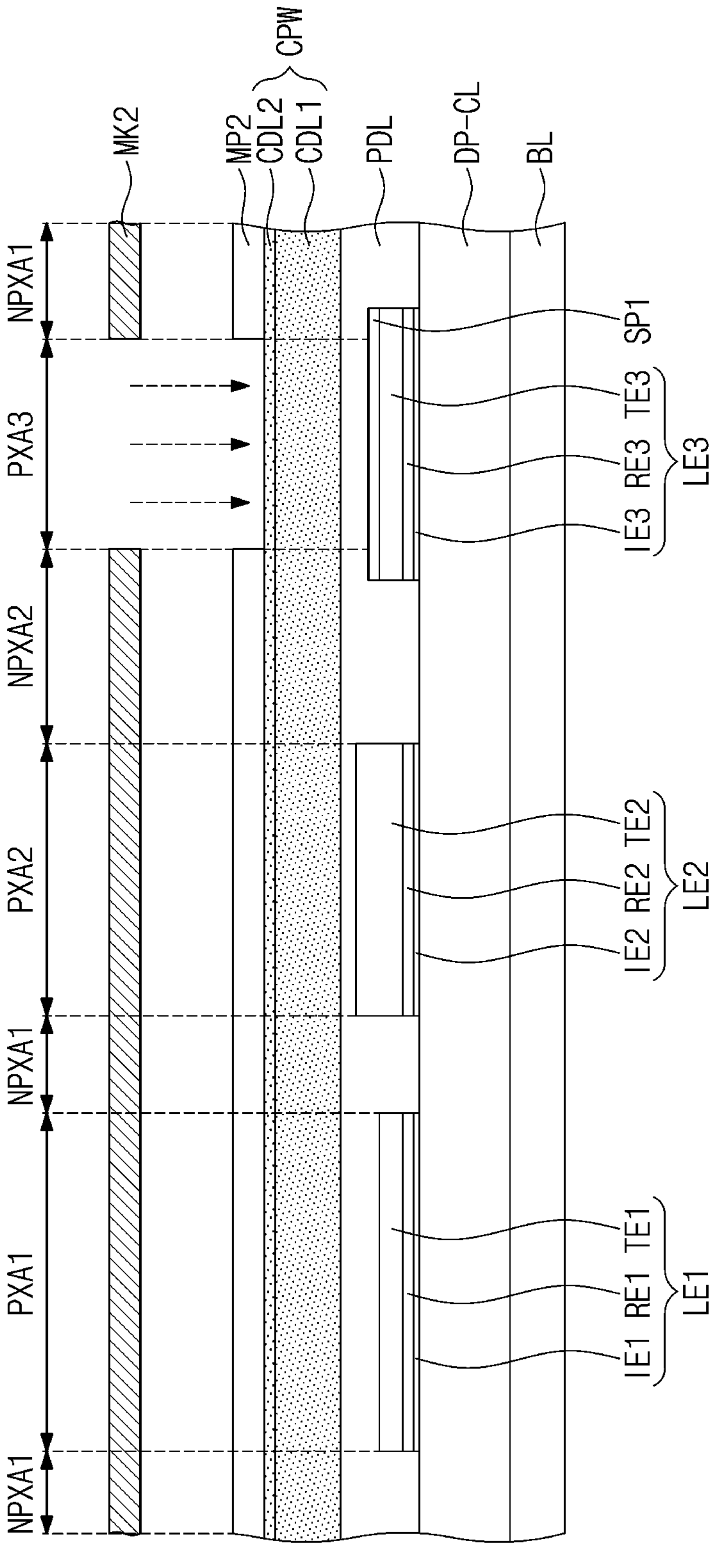

Referring to FIG. 12E, a second mask pattern MP2 may be formed on the second conductive layer CDL2. An opening may be formed in the second mask pattern MP2 using the second mask MK2 in which an opening corresponding to the third emission area PXA3 is defined. The second mask pattern MP2 may be photoresist. An opening corresponding to the third lower electrode LE3 may be formed in the second mask pattern MP2 through exposure and development processes.

Figure 12F:
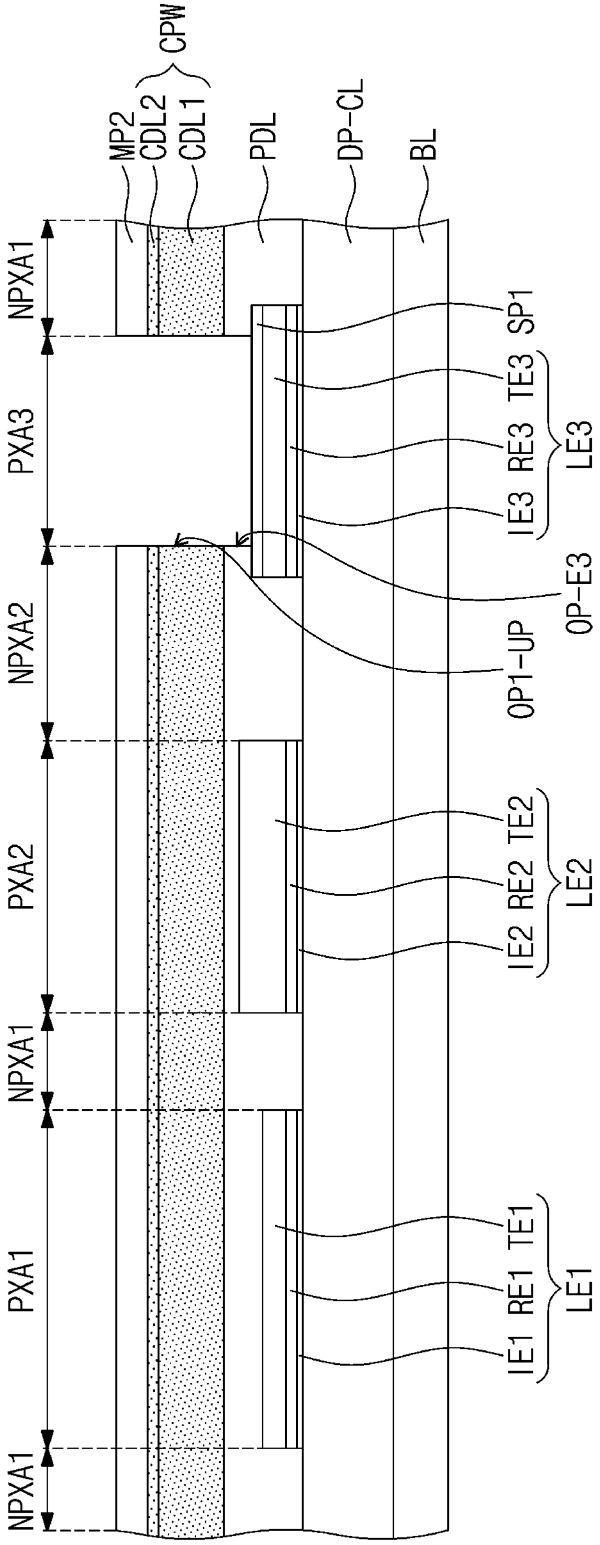

Referring to FIG. 12F, the first conductive layer CDL1, the second conductive layer CDL2, and the pixel defining film PDL may be etched using the second mask pattern MP2 as a mask. The first preliminary upper opening OP1-UP may be formed by dry etching the first conductive layer CDL1 and the second conductive layer CDL2. A third emission opening OP-E3 may be formed by dry etching the pixel defining film PDL.

Figure 12G:
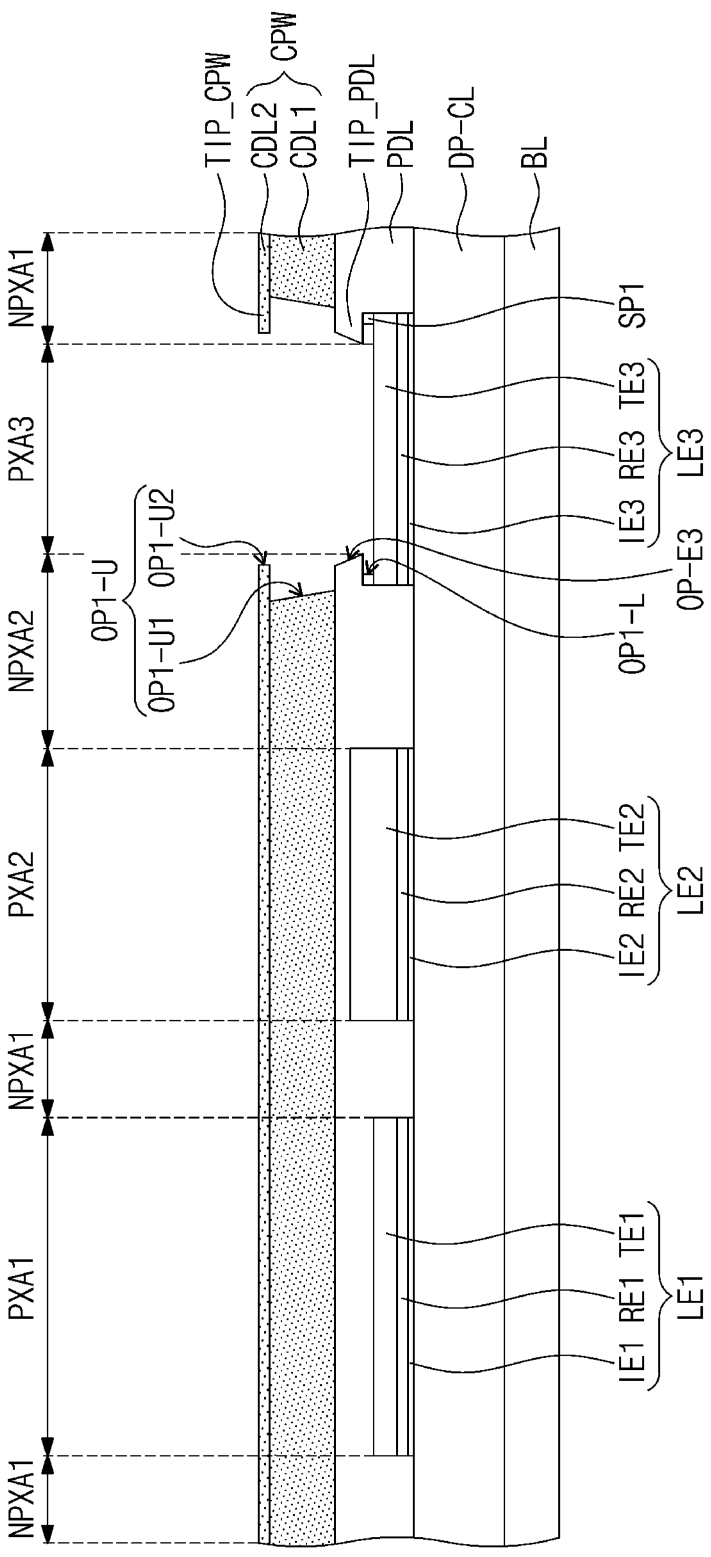

Referring to FIG. 12G, a first lower opening OP1-L may be formed in the first sacrificial pattern SP1. The first sacrificial pattern SP1 may be wet etched using a pixel defining film PDL as a mask. The first lower opening OP1-L may have an area larger than an area of the third emission opening OP-E3. A tip-portion TIP_PDL may be formed on a pixel defining film PDL. The etching rate of the third lower electrode LE3 with respect to the etching solution may be very low compared to the etching rate of the first sacrificial pattern SP1. Therefore, it is possible to prevent the third lower electrode LE3 from being etched and damaged during the etching process of the first sacrificial pattern SP1.

The first upper opening OP1-U may be formed by wet etching the first conductive layer CDL1 and the second conductive layer CDL2. Through the etching process, a conductive bank CPW in which the first upper opening OP1-U is defined may be formed. In the wet etching process of the first conductive layer CDL1 and the second conductive layer CDL2, as the etch rate of the first conductive layer CDL1 with respect to the etching solution is greater than the etch rate of the second conductive layer CDL2, the first conductive layer CDL1 may be etched.

Accordingly, after the wet etching is completed, on the cross section, an inner surface of the second conductive layer CDL2 defining the second area OP1-U2 of the first upper opening OP1-U may be closer to the center of the first lower electrode LE1 than the inner surface of the first conductive layer CDL1 defining the first area OP1-U1 of the first upper opening OP1-U. A tip-portion TIP_CPW may be formed in the second conductive layer CDL2 of the conductive bank CPW. The conductive bank CPW may surround the third emission area PXA3 in a plan view.

Figure 12H:
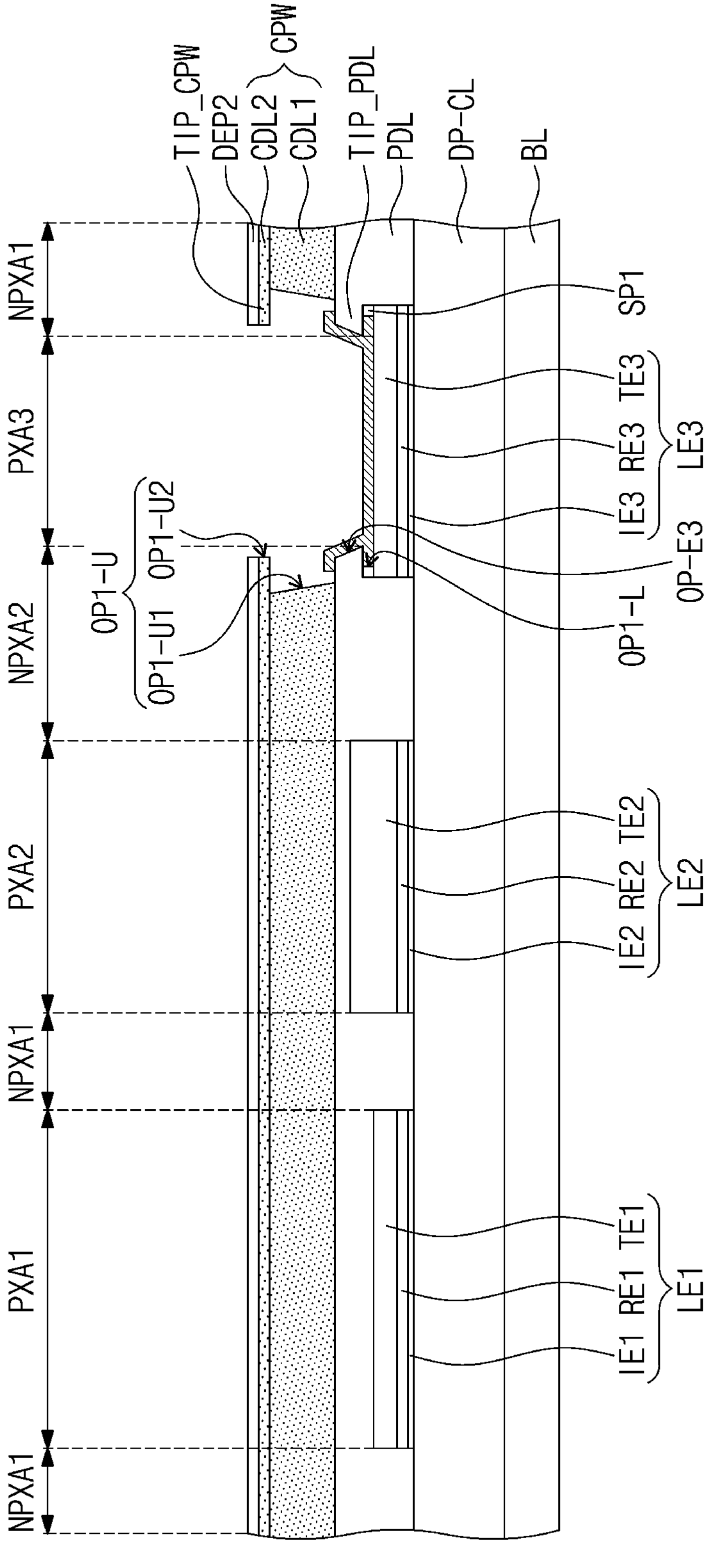

Referring to FIG. 12H, an auxiliary emission pattern EP2 may be formed on the third lower electrode LE3. The auxiliary emission pattern EP2 may correspond to the third emission area PXA3. An auxiliary emission pattern EP2 may be formed through a thermal evaporation process. An auxiliary emission pattern EP2 may be formed inside the first lower opening OP1-L, the third emission opening OP-E3, and the first upper opening OP1-U.

A dummy auxiliary emission pattern DEP2 may be formed on the second conductive layer CDL2. The dummy auxiliary emission pattern DEP2 may be formed by the same process as the auxiliary emission pattern EP2 and include a same material.

Figure 12I:
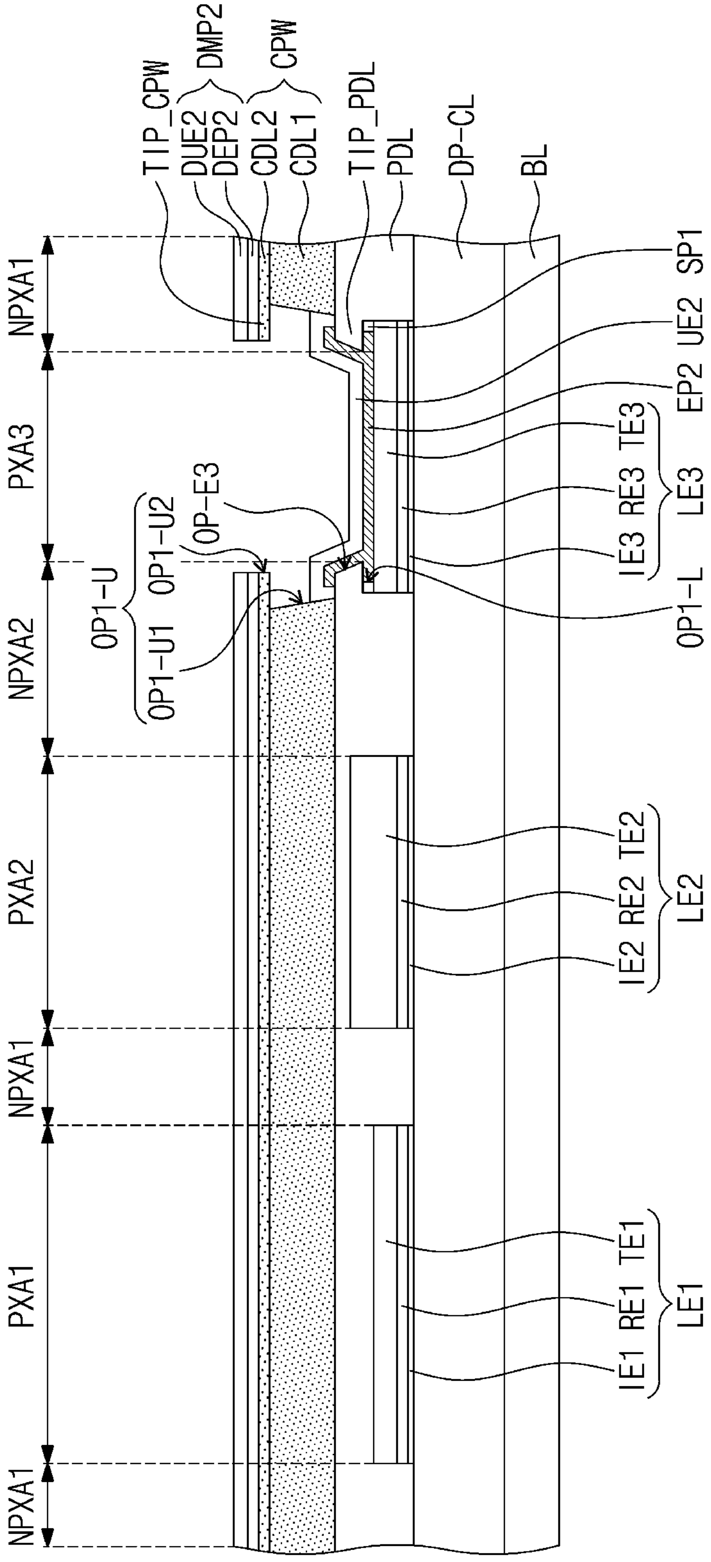

Referring to FIG. 12I, a second upper electrode UE2 contacting a side surface of the conductive bank CPW may be formed on the auxiliary emission pattern EP2. The second upper electrode UE2 may be formed through a sputtering process. The second upper electrode UE2 may be formed inside the first upper opening OP1-U. The second upper electrode UE2 is provided at a higher incident angle than the auxiliary emission pattern EP2 and may be formed to contact the inner surface of the first conductive layer CDL1 defining the first upper opening OP1-U.

A dummy second upper electrode DUE2 may be formed on the dummy auxiliary emission pattern DEP2 at the same time as the second upper electrode UE2. The dummy second upper electrode DUE2 may be formed by the same process as the second upper electrode UE2 and may include a same material.

Figure 12J:
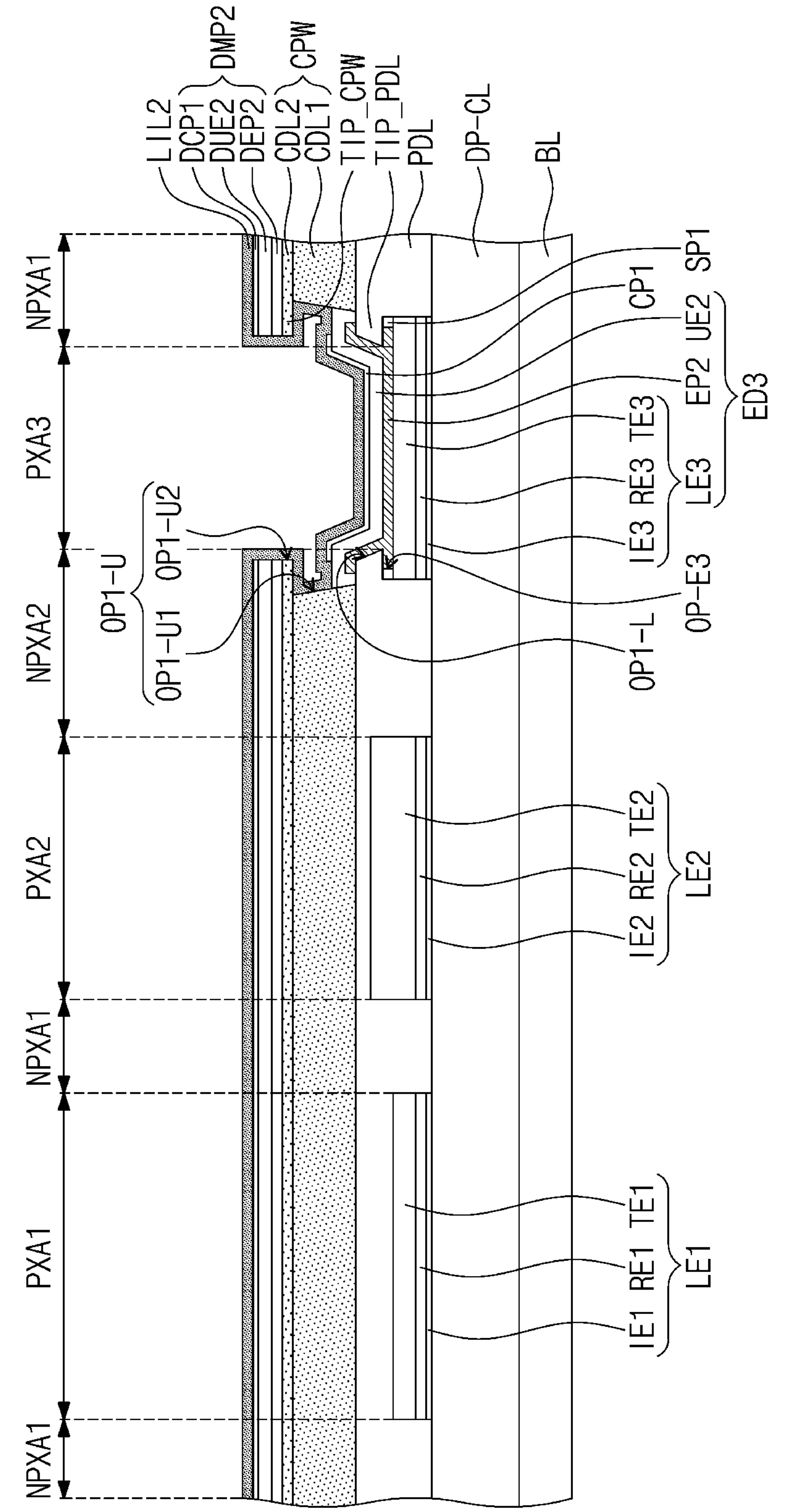

Referring to FIG. 12J, a first capping pattern CP1 may be formed on the first upper electrode UE1. The first capping pattern CP1 may be disposed inside the first upper opening OP1-U. A first dummy capping pattern DCP1 may be formed on the dummy second upper electrode DUE2 at the same time as the first capping pattern CP1. The dummy first capping pattern DCP1 may be formed by the same process as the first capping pattern CP1 and may include a same material.

The second encapsulation inorganic pattern LIL2 may be formed through a chemical vapor deposition (CVD) process. The second encapsulation inorganic pattern LIL2 may be formed on the conductive bank CPW and the second upper electrode UE2 and may be disposed inside the first upper opening OP1-U.

Figure 12K:
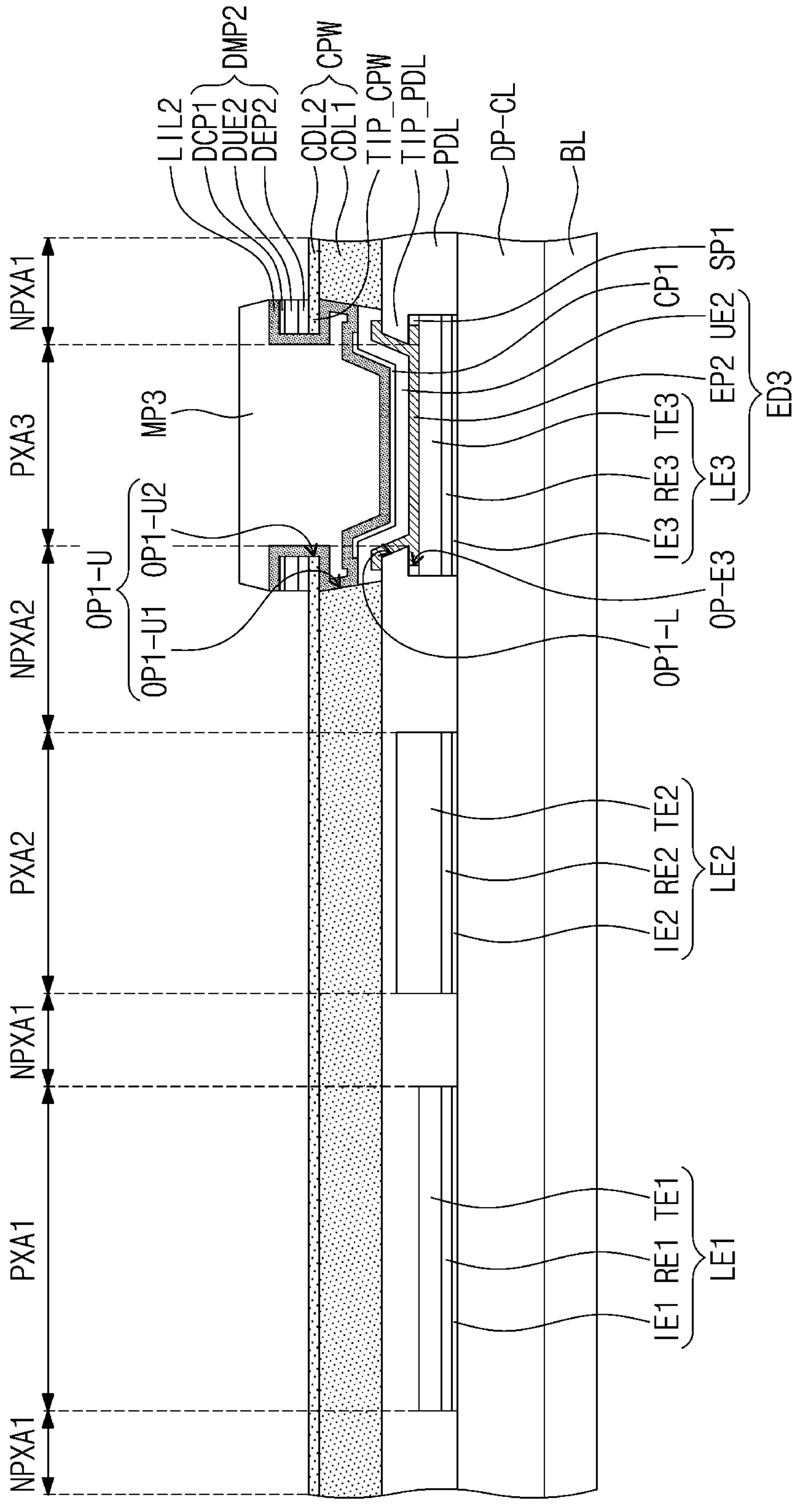
Figure 12L:
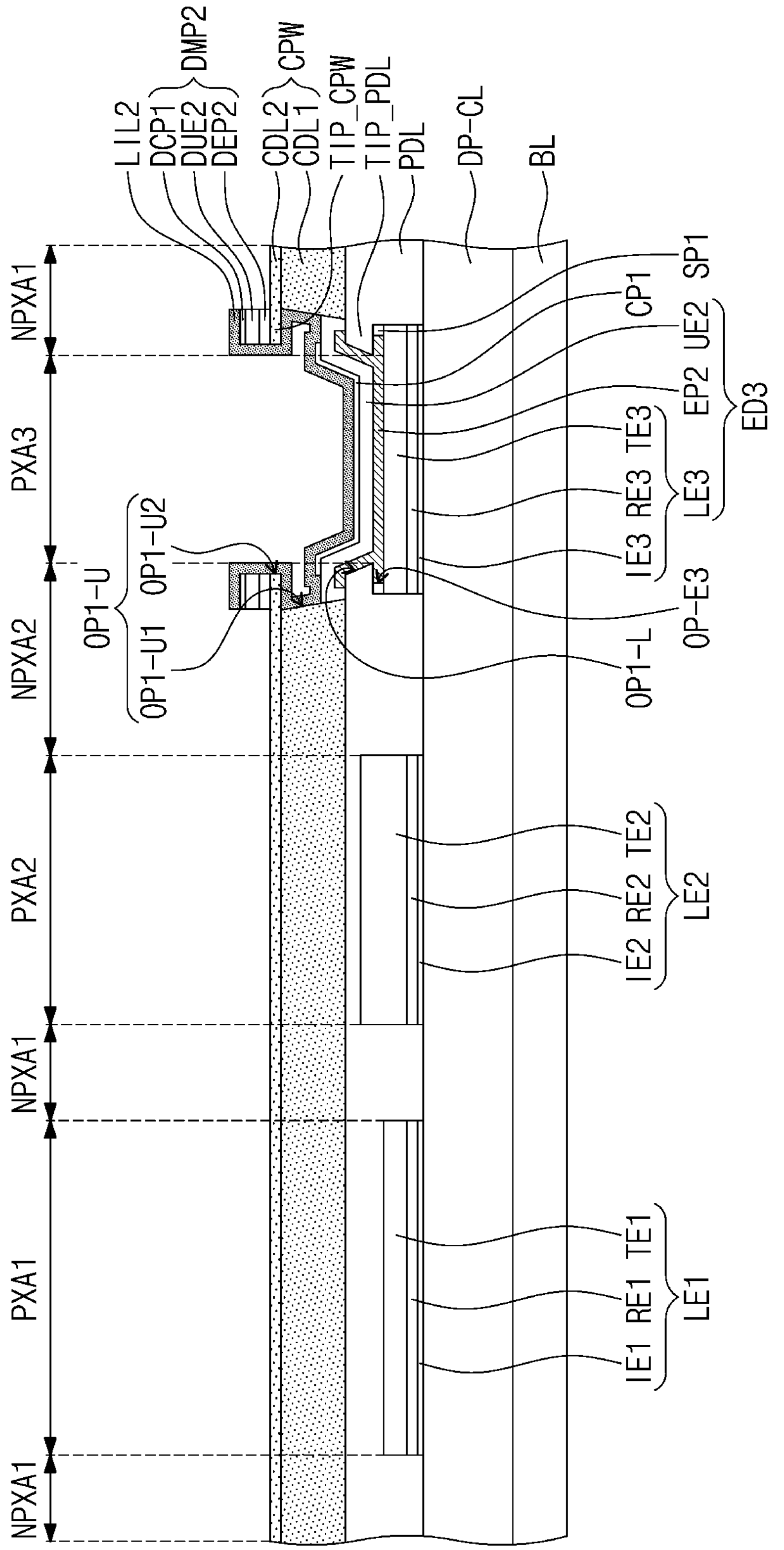

Referring to FIGS. 12K and 12L, an area corresponding to the third emission area PXA3 may be covered using the third mask pattern MP3. The third mask pattern MP3 may be formed through exposure and development processes using a mask. The second dummy pattern DMP2 may include a dummy auxiliary emission pattern DEP2, a second dummy upper electrode DUE2, and a first dummy capping pattern DCP1. Part of the second encapsulation inorganic pattern LIL2 disposed on the second dummy pattern DMP2 and the second conductive layer CDL2 may be etched and removed using the third mask pattern MP3 as a mask. After the etching step, the third mask pattern MP3 may be removed.

Figure 13A:
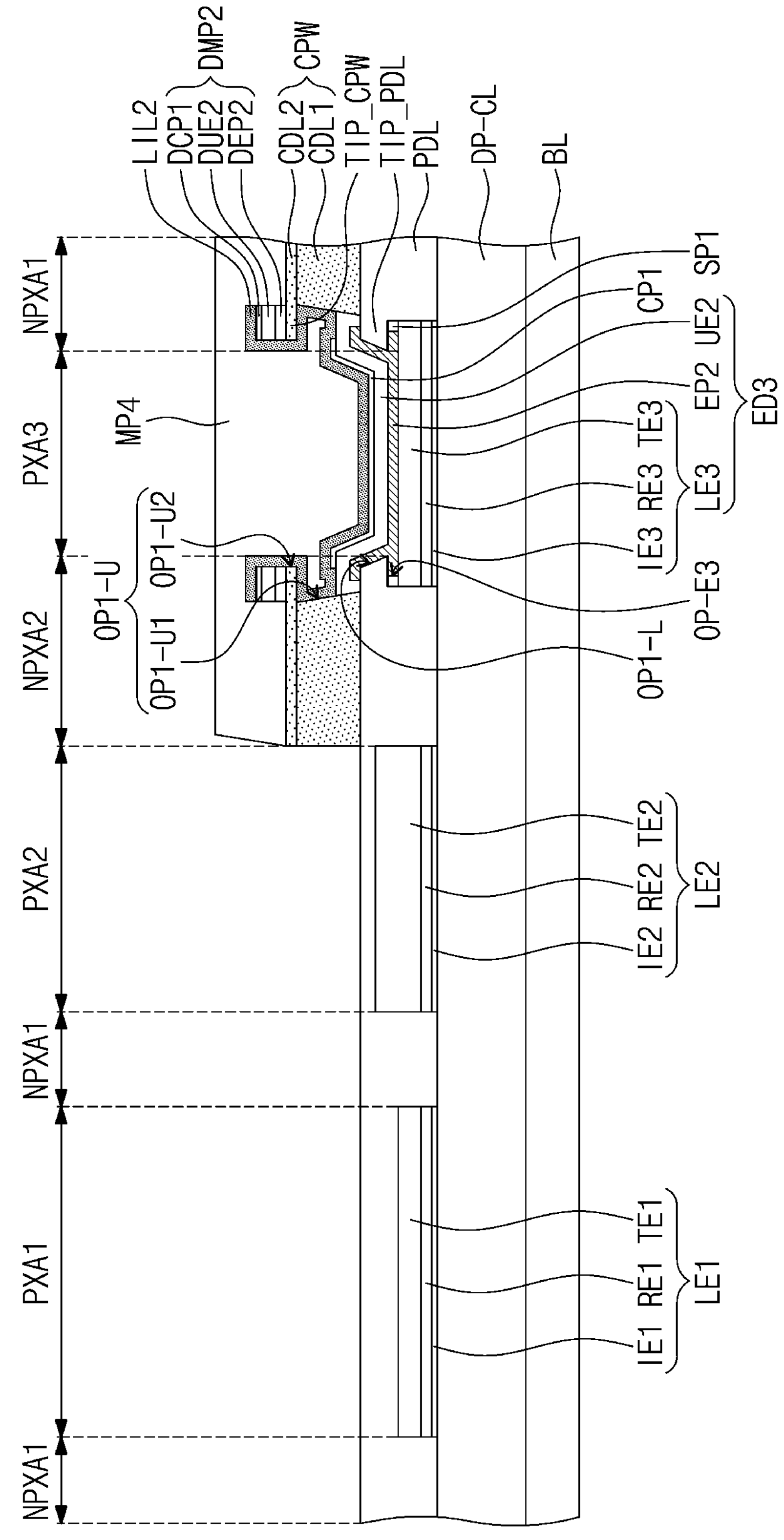
FIGS. 13A to 13G are schematic cross-sectional views sequentially illustrating some steps of a method of manufacturing a display device according to an embodiment of this disclosure.

FIGS. 13A to 13H are schematic cross-sectional views sequentially illustrating some steps of a method of manufacturing a display device DD according to an embodiment of this disclosure. Referring to FIG. 13A, a fourth mask pattern MP4 in which openings corresponding to the first and second emission areas PXA1 and PXA2 are defined may be formed. The opening of the fourth mask pattern MP4 may be formed through exposure and development processes using a mask. The first conductive layer CDL1 and the second conductive layer CDL2 may be etched and removed using the fourth mask pattern MP4 as a mask. A dry etching process may be used. Openings corresponding to the first emission area PXA1 and the second emission area PXA2 may be formed in the first conductive layer CDL1 and the second conductive layer CDL2.

Figure 13B:
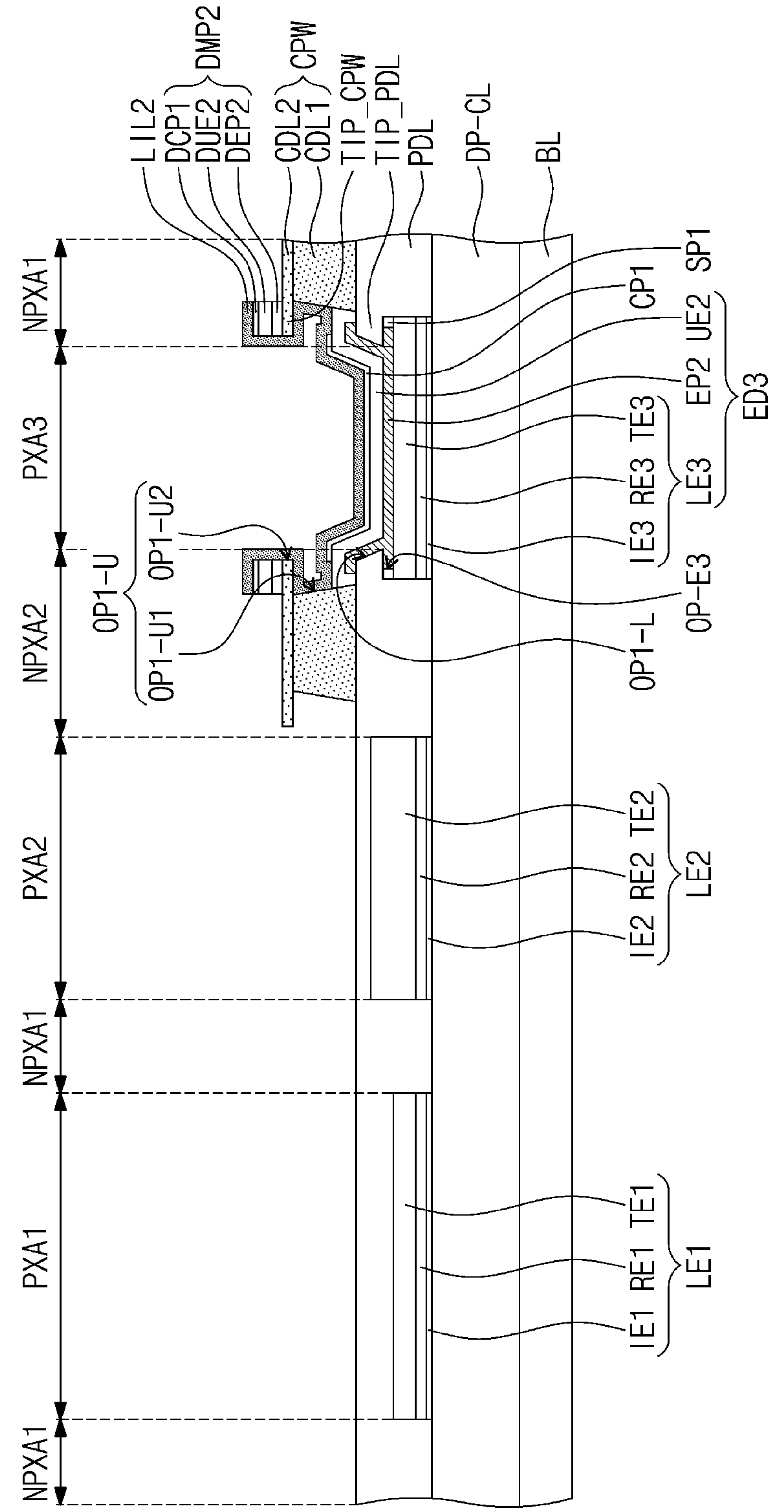

Referring to FIG. 13B, the conductive bank CPW may be formed by wet etching the first conductive layer CDL1 and the second conductive layer CDL2. In the wet etching process of the first conductive layer CDL1 and the second conductive layer CDL2, as the etch rate of the first conductive layer CDL1 with respect to the etching solution is greater than the etch rate of the second conductive layer CDL2, the first conductive layer CDL1 may be etched.

Figure 13C:
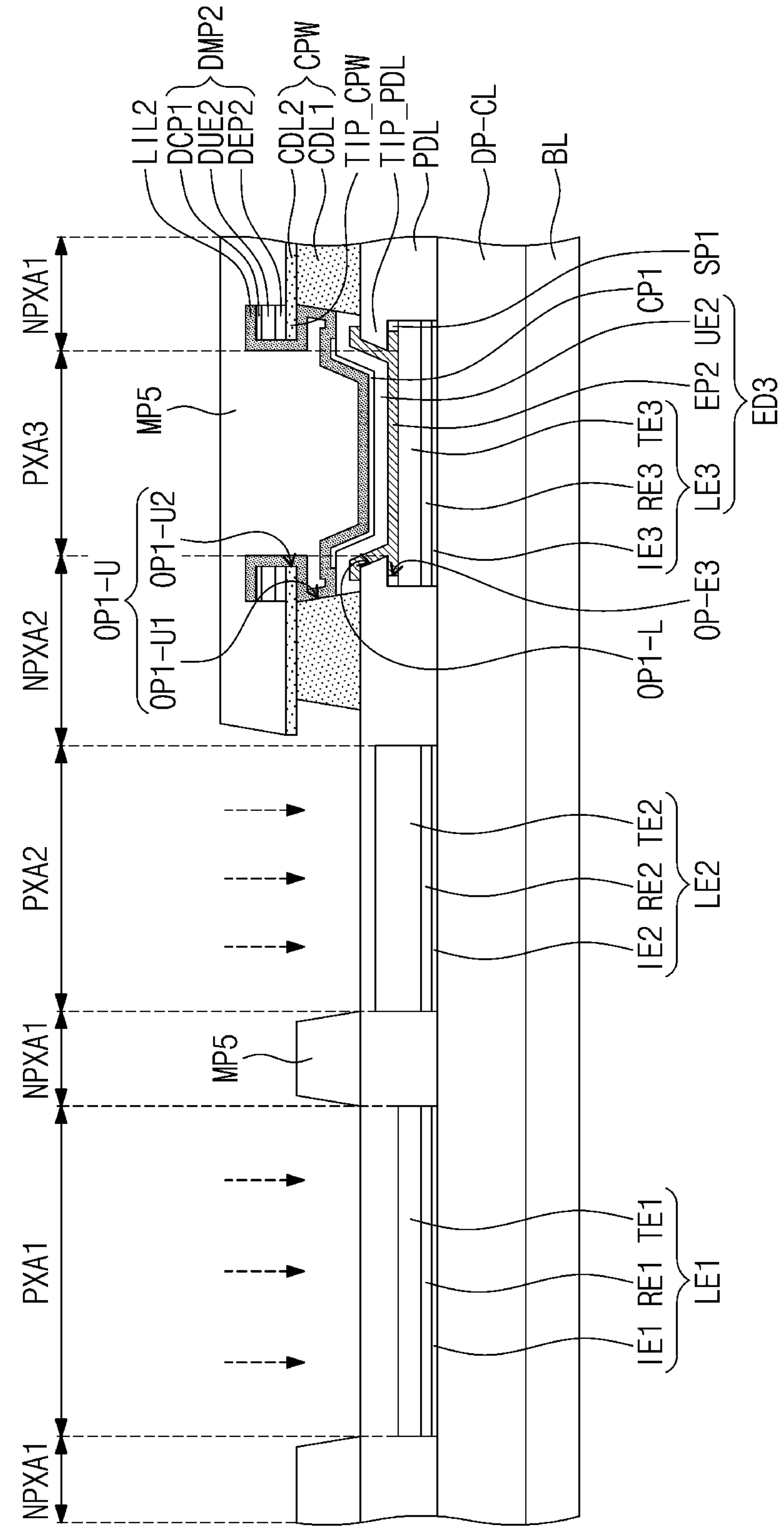
Figure 13D:
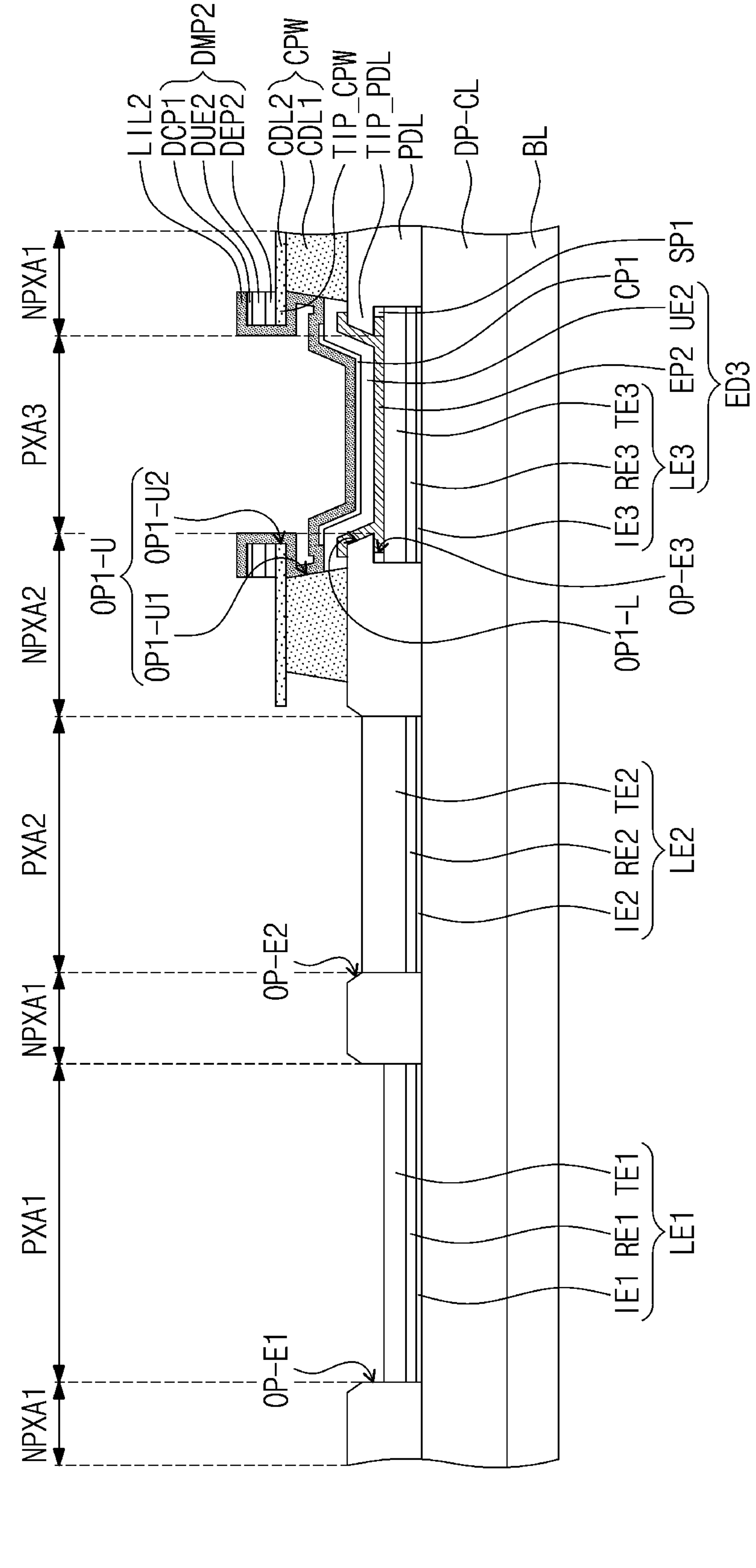

Referring to FIGS. 13C and 13D, a fifth mask pattern MP5 having openings corresponding to each of the first emission area PXA1 and the second emission area PXA2 may be formed. The fifth mask pattern MP5 may be formed through exposure and development processes using a mask. By using the fifth mask pattern MP5 as a mask, a first emission opening OP-E1 and a second emission opening OP-E2 corresponding to the first lower electrode LE1 and the second lower electrode LE2, respectively, may be formed on the pixel defining film PDL.

Figure 13E:
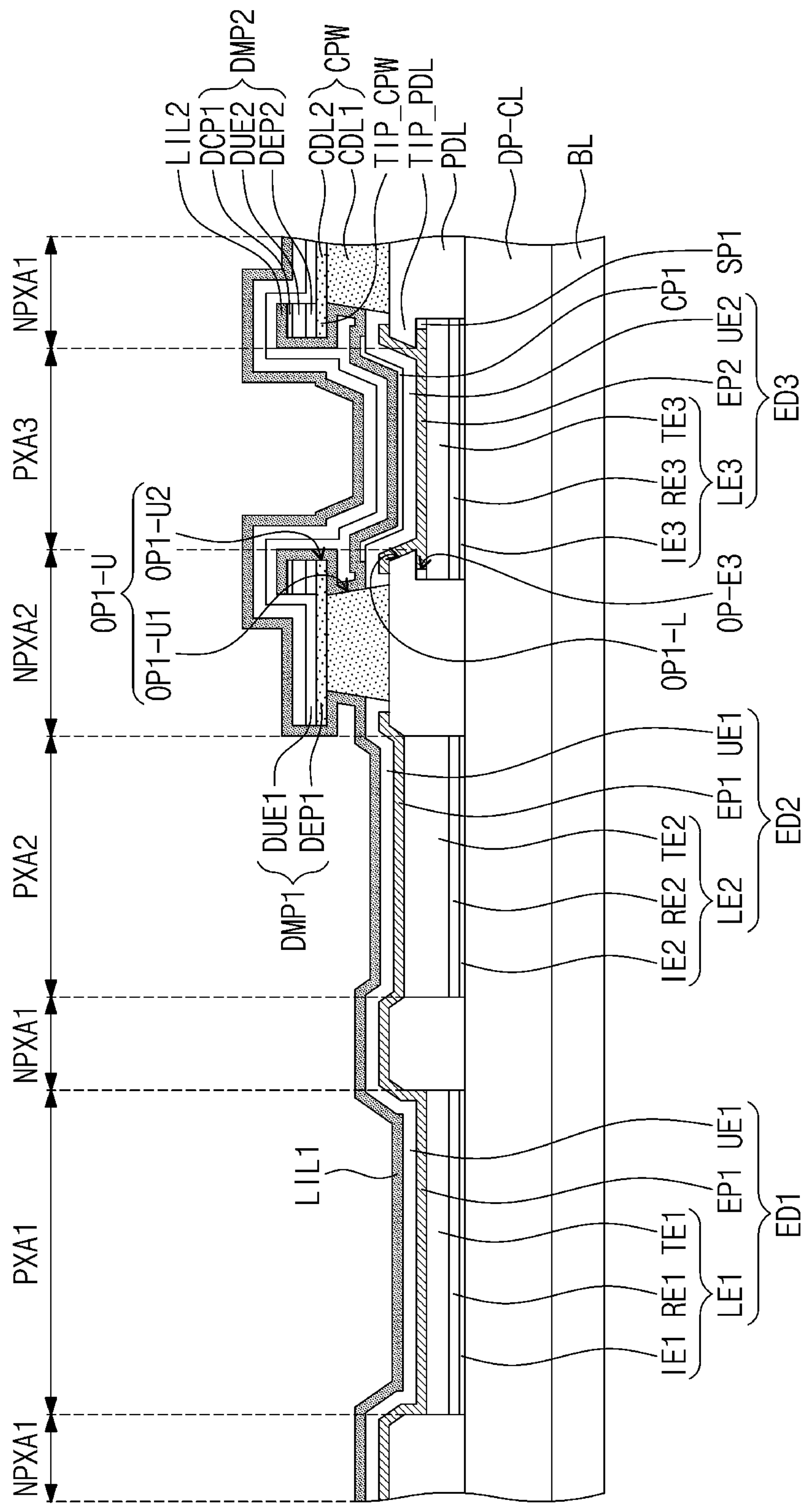

Referring to FIG. 13E, a common emission pattern EP1 may be disposed on the first lower electrode LE1 and the second lower electrode LE2. The common emission pattern EP1 may overlap the first emission area PXA1 and the second emission area PXA2. The common emission pattern EP1 may also overlap the first non-emission area NXPA1. The common emission pattern EP1 may be formed through a thermal evaporation process. At the same time, a dummy common emission pattern DEP1 may be formed overlapping the third emission area PXA3 and the second emission area NPXA2.

A first upper electrode UE1 contacting a side surface of the conductive bank CPW may be formed on the common emission pattern EP1. The first upper electrode UE1 may be formed through a sputtering process. The first upper electrode UE1 may be provided at an incident angle higher than that of the common emission pattern EP1 and may be formed to contact and be electrically connected to the inner surface of the first conductive layer CDL1. At the same time, a dummy first upper electrode DUE1 disposed on the dummy common emission pattern DEP1 may be formed. The dummy first upper electrode DUE1 may overlap the third emission area PXA3 and the second emission area NPXA2. The first dummy pattern DMP1 may include a dummy common emission pattern DEP1 and a dummy first upper electrode DUE1.

A first encapsulation inorganic pattern LIL1 may be formed on the first upper electrode UE1 through a chemical vapor deposition process. The first encapsulation inorganic pattern LIL1 may be disposed on the first upper electrode UE1 and the dummy first upper electrode DUE1. The first encapsulation inorganic pattern LIL1 may overlap the first to third emission areas PXA1, PXA2, and PXA3.

Figure 13F:
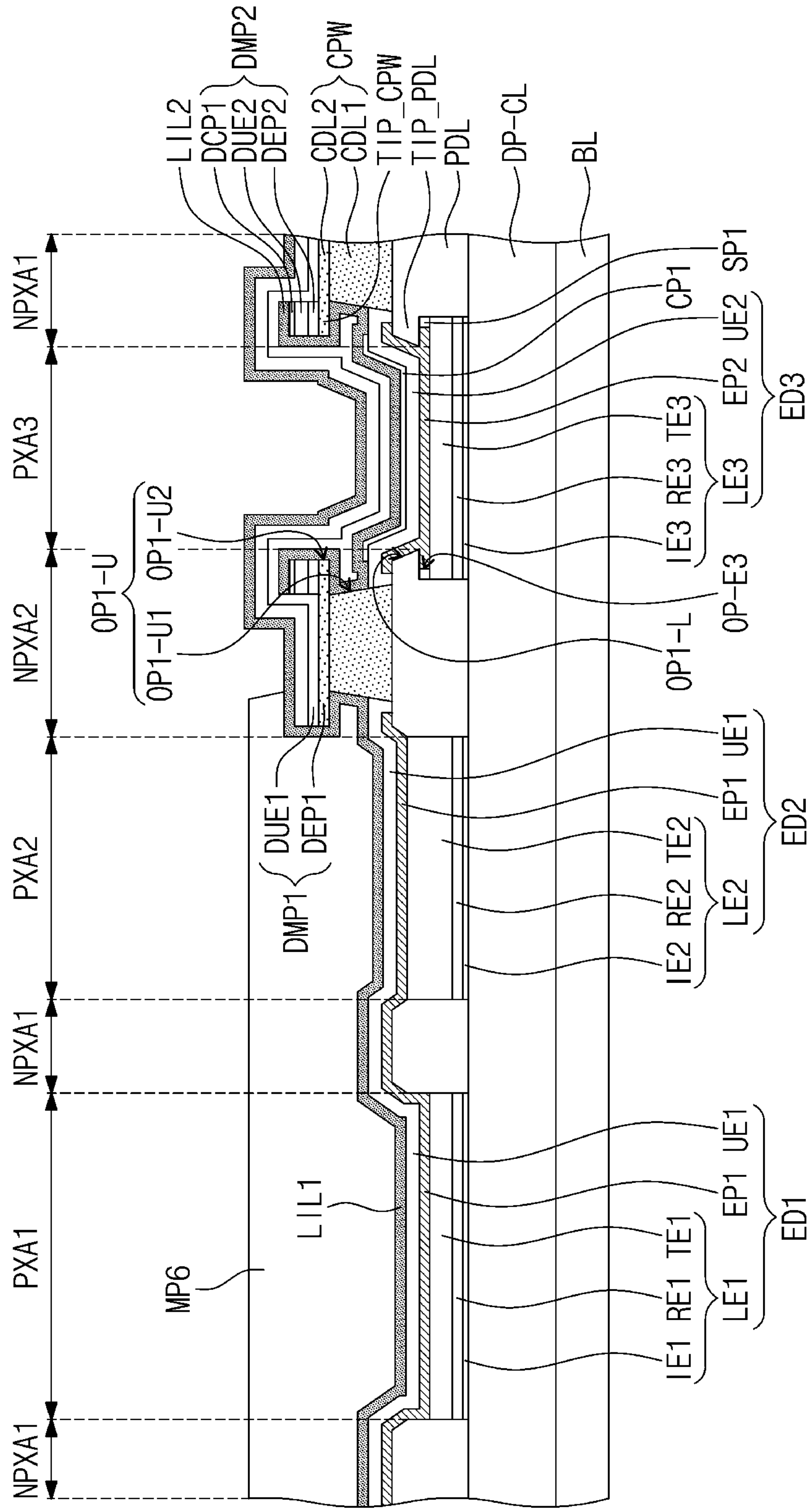
Figure 13G:
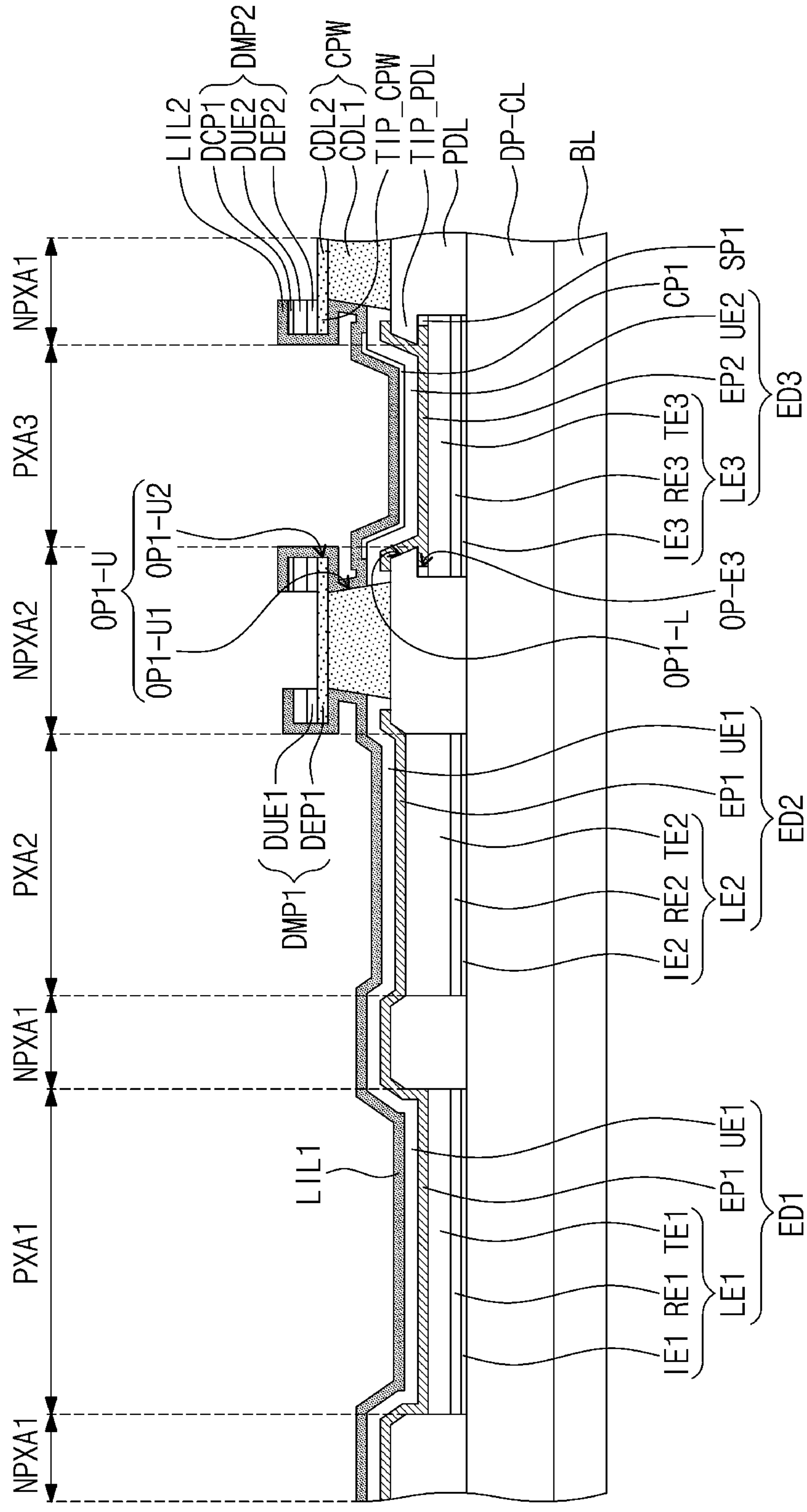

Referring to FIGS. 13F and 13G, a sixth mask pattern MP6 may be formed to overlap the first emission area PXA1, the second emission area PXA2, and the first non-emission area NPXA1. Part of the dummy common emission pattern DEP1, the dummy first upper electrode DUE1, and the first encapsulation inorganic pattern LIL1 may be etched and removed using the sixth mask pattern MP6 as a mask. All of the dummy common emission pattern DEP1 and the dummy first upper electrode DUE1 may be removed except for a part disposed on a side of the upper surface of the second conductive layer CDL2.

Figure 14A:
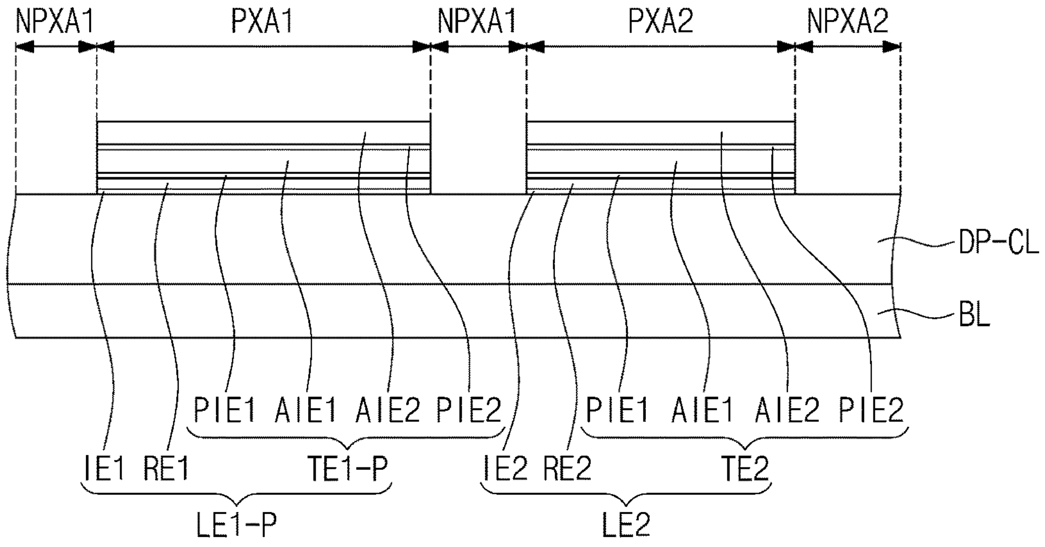
FIGS. 14A to 14C are schematic cross-sectional views sequentially illustrating some steps of a method of manufacturing a display device according to an embodiment of this disclosure.
Figure 14B:
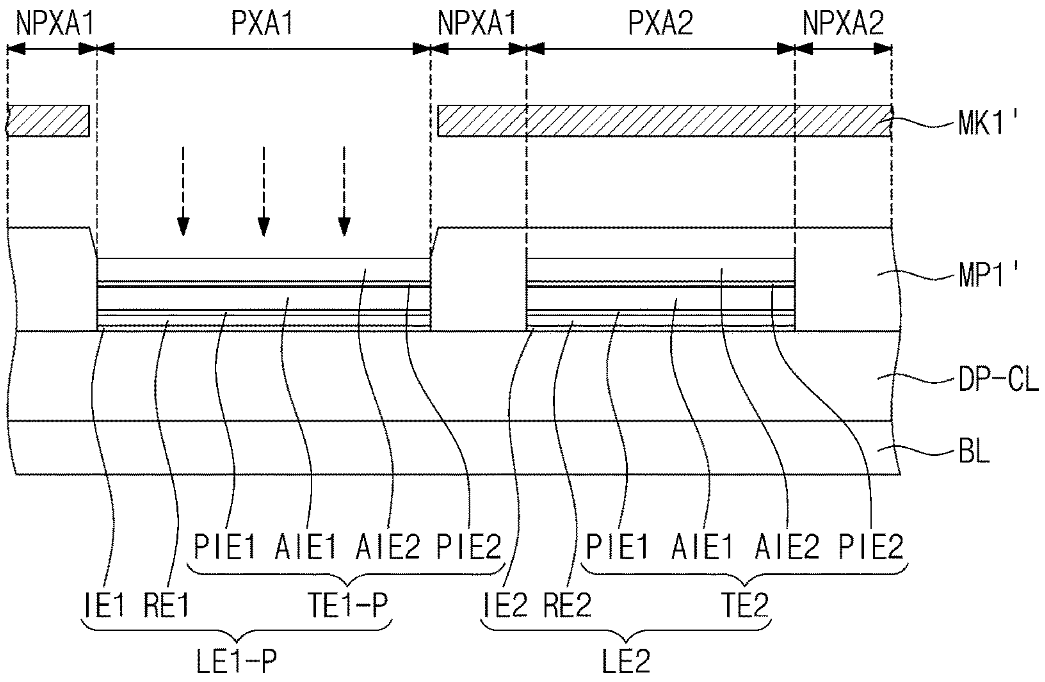
Figure 14C:
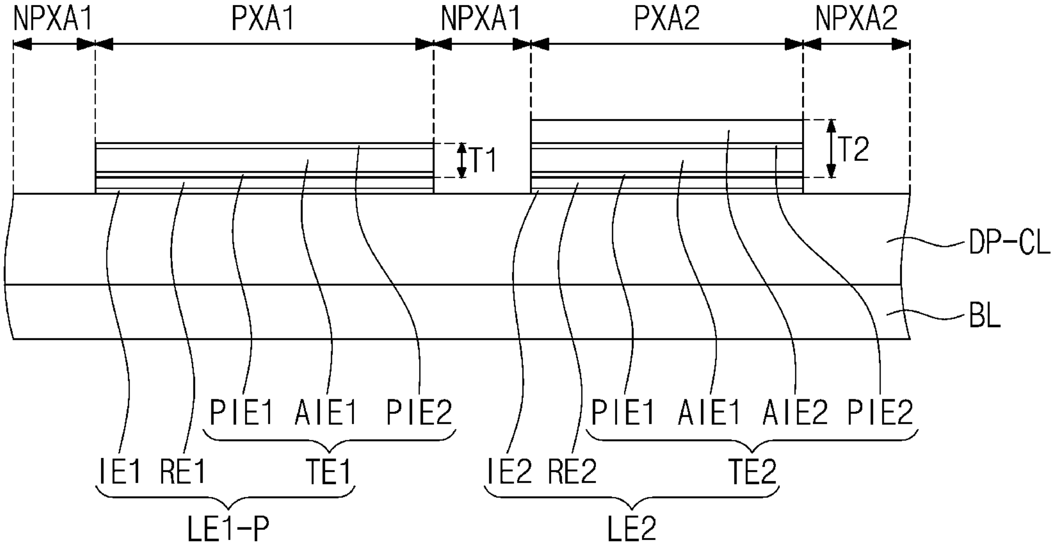

FIGS. 14A to 14C are schematic cross-sectional views sequentially illustrating some steps of a method of manufacturing a display device DD according to an embodiment of this disclosure. Here, the third emission area PXA3 and the third lower electrode LE3 are not shown.

Referring to FIG. 14A, a preliminary first lower electrode LE1-P and a second lower electrode LE2 may be formed on the base layer BL including first and second emission areas PXA1 and PXA2 and non-emission areas NPXA1 and NPXA2.

The preliminary first lower electrode LE1-P may overlap the first emission area PXA1. The second lower electrode LE2 may overlap the second emission area PXA2. The preliminary first lower electrode LE1-P may have a structure in which a first oxidation electrode IE1, a first reflective electrode RE1, and a preliminary first transparent oxide electrode TE1-P are sequentially stacked on each other. Here, the preliminary first transparent oxide electrode TE1-P may include a first crystallized region PIE1, a first amorphous region AIE1, a second crystallized region PIE2, and a second amorphous region AIE2.

The second lower electrode LE2 may have a structure in which a second oxidation electrode IE2, a second reflective electrode RE2, and a second transparent oxide electrode TE2 are sequentially stacked on each other. Here, the second transparent oxide electrode TE2 may include a first crystallized region PIE1, a first amorphous region AIE1, a second crystallized region PIE2, and a second amorphous region AIE2.

Referring to FIGS. 14B and 14C, a first auxiliary mask pattern MP1' defining an opening corresponding to the first emission area PXA1 may be formed. The opening of the first auxiliary mask pattern MP1' may be formed through an exposure and development process using the first mask MK1. Thereafter, the second amorphous region AIE2 may be wet etched using the first auxiliary mask pattern MP1' as a mask. At this time, portions of the second amorphous region AIE2 corresponding to the first emission area PXA1 may be etched and removed.

Compared to the first amorphous region AIE1, the second crystallized region PIE2 may have a very low etching rate for an etchant in wet etching. Accordingly, the second crystallized region PIE2 disposed below the second amorphous region AIE2 may serve as an etch stop preventing further etching by the etchant.

As such, since the second crystallized region PIE2 is prevented from being further etched in the wet etching process, the thickness of the first amorphous region AIE1 may be precisely controlled. Compared to the case of adjusting the thickness of the first amorphous region AIE1 by simply adjusting the etch time, in case that the second crystallized region PIE2 is no longer etched, the thickness of the first amorphous region AIE1 may be accurately controlled.

According to this disclosure, the distance between pixels may be reduced by including a common emission pattern overlapping the first emission area and the second emission area and a conductive bank surrounding the third emission area. Through this, it is possible to provide a high-resolution display device.

According to this disclosure, it is possible to provide a display device manufacturing method in which a process is simplified and process costs may be reduced by not manufacturing a separate mask for patterning an organic pattern in pixel portions.

Although the embodiments of this disclosure have been described, it is understood that this disclosure should not be limited to these embodiments but various changes and modifications may be made by one ordinary skilled in the art within the spirit and scope of this disclosure as hereinafter claimed.

What is claimed is:

1. A display device comprising:

a base layer including a display area and a non-display area, the display area including a first emission area, a second emission area, a third emission area, and a plurality of non-emission areas;

a first lower electrode disposed on the base layer and overlapping the first emission area;

a second lower electrode disposed on the base layer and overlapping the second emission area;

a third lower electrode disposed on the base layer and overlapping the third emission area;

a pixel defining film exposing upper surfaces of each of the first to third lower electrodes;

a conductive bank disposed on the pixel defining film and surrounding the third emission area in a plan view;

a common emission pattern disposed on the first lower electrode and the second lower electrode and overlapping the first emission area, the second emission area, and one of the plurality of non-emission areas disposed between the first emission area and the second emission area; and an auxiliary emission pattern disposed on the third lower electrode and overlapping the third emission area.

2. The display device of claim 1, further comprising:

a first upper electrode disposed on the common emission pattern and electrically connected to a side surface of the conductive bank; and a second upper electrode disposed on the auxiliary emission pattern and electrically connected to another side surface of the conductive bank.

3. The display device of claim 2, further comprising:

a first encapsulation inorganic pattern covering the first upper electrode and overlapping the first emission area and the second emission area; and a second encapsulation inorganic pattern covering the second upper electrode and overlapping the third emission area.

4. The display device of claim 2, wherein the conductive bank comprises:

a first conductive layer having a first conductivity; and a second conductive layer disposed on the first conductive layer and having a second conductivity lower than the first conductivity, wherein a thickness of the first conductive layer is greater than a thickness of the second conductive layer.

5. The display device of claim 4, further comprising:

a first dummy pattern disposed on a side of an upper surface of the second conductive layer, wherein the first dummy pattern comprises:

a dummy common emission pattern disposed on the upper surface of the second conductive layer and including a same material as the common emission pattern; and a dummy first upper electrode disposed on the dummy common emission pattern and including a same material as the first upper electrode.

6. The display device of claim 4, further comprising:

a second dummy pattern disposed on a side of an upper surface of the second conductive layer, wherein the second dummy pattern comprises:

a dummy auxiliary emission pattern disposed on the upper surface of the second conductive layer and including a same material as the auxiliary emission pattern; and a dummy second upper electrode disposed on the dummy auxiliary emission pattern and including a same material as the second upper electrode.

7. The display device of claim 1, wherein a first opening corresponding to the third emission area is defined in the conductive bank, and the auxiliary emission pattern is disposed within the first opening.

8. The display device of claim 1, wherein the common emission pattern comprises:

a first color light emitting layer; and a second color light emitting layer disposed on the first color light emitting layer and including a material different from a material of the first color light emitting layer.

9. The display device of claim 1, wherein the first lower electrode comprises a first reflective electrode and a first transparent oxide electrode disposed on the first reflective electrode, the second lower electrode comprises a second reflective electrode and a second transparent oxide electrode disposed on the second reflective electrode, a thickness of the second transparent oxide electrode is greater than a thickness of the first transparent oxide electrode.

10. The display device of claim 9, wherein the first transparent oxide electrode comprises a first crystallized region, and the second transparent oxide electrode comprises a second crystallized region and an amorphous region disposed on the second crystallized region.

11. The display device of claim 10, wherein an etch rate of the amorphous region in an etching solution is greater than an etch rate of each of the second crystallized region and an etch rate of the first crystallized region.

12. The display device of claim 1, wherein a minimum separation distance between the first lower electrode and the second lower electrode in a plan view is smaller than a minimum separation distance between the second lower electrode and the third lower electrode in a plan view.

13. The display device of claim 1, wherein the conductive bank does not overlap an area between the first lower electrode and the second lower electrode in the one of the plurality of non-emission areas.

14. The display device of claim 1, further comprising:

a sacrificial pattern disposed on an outer region of the third lower electrode and disposed between the third lower electrode and the pixel defining film.

15. A method of manufacturing a display device, the method comprising:

providing a base layer including a display area and a non-display area, the display area including a first emission area, a second emission area, a third emission area, and a plurality of non-emission areas;

forming a first lower electrode on the base layer, the first lower electrode overlapping a first emission area;

forming a second lower electrode on the base layer, the second lower electrode overlapping a second emission area;

forming a third lower electrode on the base layer, the third lower electrode overlapping a third emission area;

forming a pixel defining film on the base layer and exposing an upper surface of each of the first to third lower electrodes;

forming a conductive bank on the pixel defining film and surrounding the third emission area in a plan view;

forming an auxiliary emission pattern on the third lower electrode and overlapping the third emission area; and forming a common emission pattern on the first lower electrode and the second lower electrode and overlapping the first emission area, the second emission area, and one of the plurality of non-emission areas disposed between the first emission area and the second emission area.

16. The method of claim 15, wherein the forming of the first lower electrode comprises:

forming a preliminary first lower electrode on the base layer and overlapping the first emission area; and forming the first lower electrode by etching a portion of an upper side of the preliminary first lower electrode.

17. The method of claim 15, further comprising:

after the forming of the auxiliary emission pattern, forming a first upper electrode on the auxiliary emission pattern, the first upper electrode pattern being electrically connected to a side surface of the conductive bank.

18. The method of claim 15, further comprising:

after the forming of the common emission pattern, forming a second upper electrode on the common emission pattern, the second upper electrode being electrically connected to a side surface of the conductive bank.

19. The method of claim 15, wherein the forming of the conductive bank comprises:

forming a preliminary conductive bank layer on the pixel defining film;

forming a preliminary first opening corresponding to the third emission area in the preliminary conductive bank layer; and forming the first opening from the preliminary first opening of the preliminary conductive bank layer.

20. The method of claim 19, wherein the preliminary conductive bank layer comprises:

a first conductive layer having a first conductivity; and a second conductive layer disposed on the first conductive layer and having a second conductivity lower than the first conductivity, wherein in the forming of the preliminary first opening, the first conductive layer and the second conductive layer are dry etched, and in the forming of the first opening, the first conductive layer and the second conductive layer are wet etched.

* * * * *